(12) United States Patent
Sawachi et al.

(10) Patent No.: US 10,996,688 B2
(45) Date of Patent: May 4, 2021

(54) GAS SUPPLY SYSTEM AND GAS SUPPLY METHOD

(71) Applicant: TOKYO ELECTRON LIMITED, Tokyo (JP)

(72) Inventors: Atsushi Sawachi, Miyagi (JP); Norihiko Amikura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 137 days.

(21) Appl. No.: 16/180,047

(22) Filed: Nov. 5, 2018

(65) Prior Publication Data

US 2019/0138033 A1    May 9, 2019

(30) Foreign Application Priority Data

Nov. 8, 2017 (JP) .............................. JP2017-215589

(51) Int. Cl.
| | | |
|---|---|---|
| *C23C 16/52* | (2006.01) | |
| *H01J 37/32* | (2006.01) | |
| *C23C 16/44* | (2006.01) | |
| *G05D 7/06* | (2006.01) | |
| *G05D 11/13* | (2006.01) | |

(52) U.S. Cl.
CPC .......... *G05D 7/0664* (2013.01); *C23C 16/52* (2013.01); *G05D 11/132* (2013.01); *H01J 37/3244* (2013.01); *C23C 16/4412* (2013.01); *H01J 37/32449* (2013.01)

(58) Field of Classification Search
None
See application file for complete search history.

(56) References Cited

U.S. PATENT DOCUMENTS

| | | | | |
|---|---|---|---|---|
| 6,289,923 | B1 * | 9/2001 | Ohmi ................... | G05D 7/0635 137/486 |
| 2004/0092118 | A1 * | 5/2004 | Johnson .............. | H01J 37/3244 438/696 |
| 2005/0241763 | A1 * | 11/2005 | Huang .............. | C23C 16/45565 156/345.33 |
| 2010/0229976 | A1 * | 9/2010 | Hirata .................. | G05D 7/0664 137/561 A |
| 2012/0132367 | A1 * | 5/2012 | Tezuka ................ | H01J 37/3244 156/345.33 |

(Continued)

FOREIGN PATENT DOCUMENTS

JP        3856730 B2   12/2006

*Primary Examiner* — Binu Thomas
(74) *Attorney, Agent, or Firm* — Studebaker & Brackett PC

(57) ABSTRACT

A gas supply system according to the present disclosure includes a first flow channel connected to a first gas source of a first gas, formed inside a ceiling or a sidewall of the treatment container, and communicating with the treatment space through a plurality of first gas discharge holes. The gas supply system also includes a second flow channel connected to a second gas source of a second gas, formed inside the ceiling or the sidewall of the treatment container, and communicating with the treatment space through a plurality of second gas discharge holes. The gas supply system further includes a plurality of first diaphragm valves, wherein each of the first diaphragm valves is provided between the first flow channel and the first gas discharge hole to correspond to the first gas discharge hole.

13 Claims, 19 Drawing Sheets

(56) References Cited

U.S. PATENT DOCUMENTS

| | | | |
|---|---|---|---|
| 2013/0199728 A1* | 8/2013 | Kobayashi | H01J 37/32449 156/345.34 |
| 2015/0228457 A1* | 8/2015 | Yamashita | H01J 37/32449 118/723 R |
| 2018/0012735 A1* | 1/2018 | Sawachi | H01J 37/32449 |
| 2018/0130640 A1* | 5/2018 | Gregor | C23C 16/45565 |
| 2018/0299908 A1* | 10/2018 | Amikura | G05D 7/0658 |

* cited by examiner

GAS SUPPLY SYSTEM AND GAS SUPPLY METHOD

CROSS-REFERENCE TO RELATED APPLICATIONS

This application is based on and claims the benefit of priority from Japanese Patent Application No. 2017-215589 filed on Nov. 8, 2017, and the entire contents of Which are incorporated herein by reference.

TECHNICAL FIELD

Exemplary embodiments of the present disclosure relates to a gas supply system and a gas supply method.

BACKGROUND

Japanese Patent No. 3856730 discloses a gas supply system that supplies gases from a plurality of gas sources to a treatment container. The system disclosed in Japanese Patent No. 3856730 generates a mixed gas from the plurality of gas sources, then branches the generated mixed gas and supplies the branched gas to the treatment container.

SUMMARY

In an aspect, there is provided a gas supply system that supplies a gas to a treatment space within a treatment container of a substrate treatment apparatus. The system includes a first flow channel, a plurality of first gas discharge holes, a second flow channel, a second gas discharge hole, and a plurality of first diaphragm valves. The first flow channel, formed inside a ceiling or a sidewall of the treatment container, connects to a first gas source of a first gas and communicates with the treatment space through the plurality of first gas discharge holes. The second flow channel, formed inside the ceiling or the sidewall of the treatment container, connects to a second gas source of a second gas and communicates with the treatment space through the second gas discharge hole. Each of the first diaphragm valves is provided between the first flow channel and the first gas discharge hole to correspond to the first gas discharge hole.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
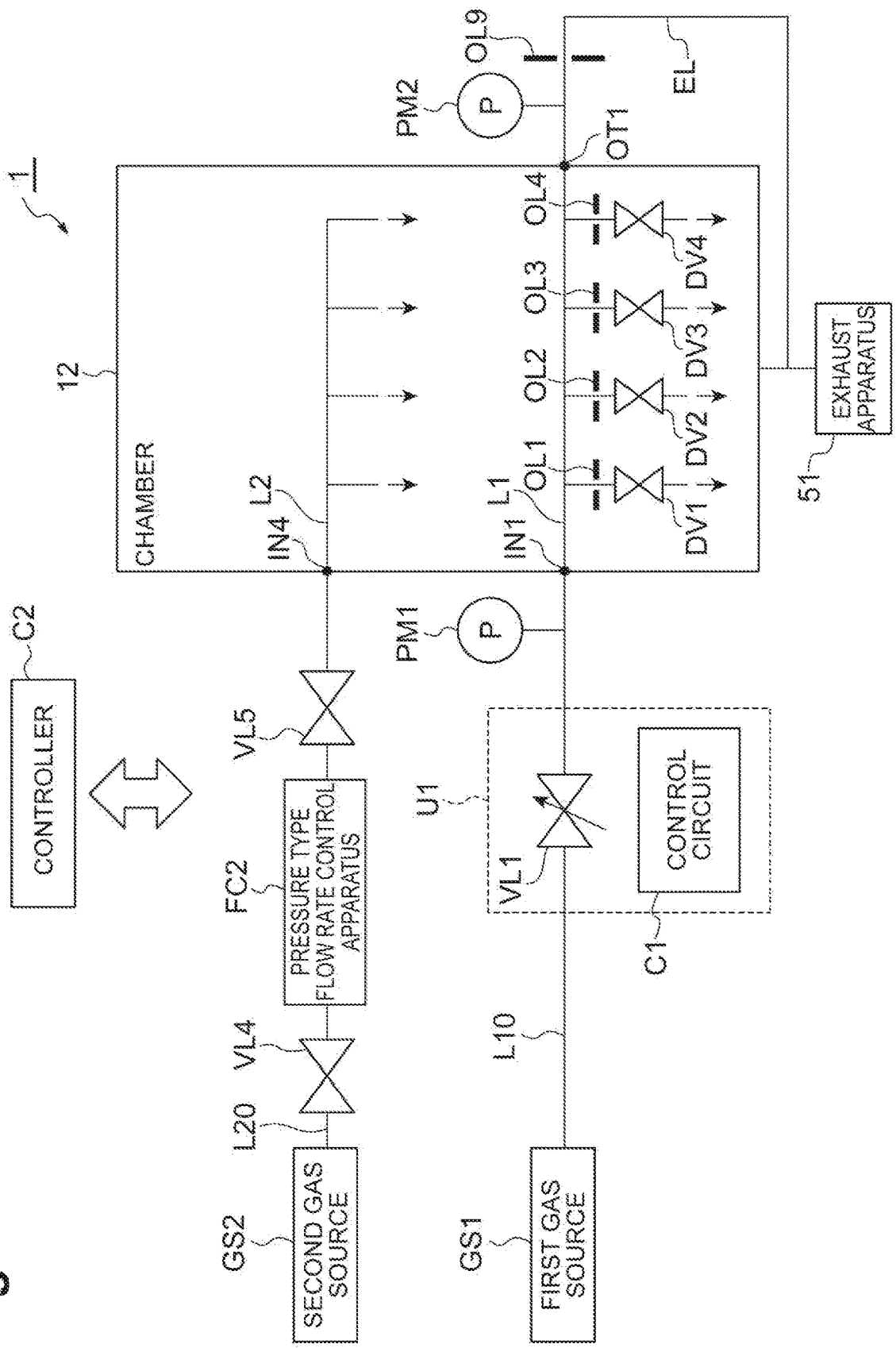
FIG. 1 is a schematic diagram of a gas supply system according to a first exemplary embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

A reduction in the size of a semiconductor device needs repeating lamination and removal in an atomic level. Such process may need to improve the response speed and switching speed of a process gas. The system disclosed in Japanese Patent No. 3856730 has room for improving the response speed and the switching speed of the process gas.

In a first aspect, there is provided a gas supply system that supplies a gas to a treatment space within a treatment container of a substrate treatment apparatus. The system includes a first flow channel, a plurality of first gas discharge holes, a second flow channel, a second gas discharge hole, and a plurality of first diaphragm valves. The first flow channel, formed inside a ceiling or a sidewall of the treatment container, connects to a first gas source of a first gas and communicates with the treatment space through the plurality of first gas discharge holes. The second flow channel, formed inside the ceiling or the sidewall of the treatment container, connects to a second gas source of a second gas and communicates with the treatment space through the second gas discharge hole. Each of the first diaphragm valves is provided between the first flow channel and the first gas discharge hole to correspond to the first gas discharge hole.

In this system, the first gas is supplied from the first flow channel through the plurality of first gas discharge holes to the treatment space, and the second gas is supplied from the second flow channel through the plurality of second gas discharge holes to the treatment space. In this manner, the first gas and the second gas are supplied to the treatment space without being merged with each other. Therefore, the gas supply system can save a time which will be taken until the merged gas reaches the treatment container, as compared with a case where the first gas and the second gas are merged with each other before these gases are supplied to the treatment container. This leads to an excellent response speed. In addition, each of the first diaphragm valves is disposed between the first flow channel and the first gas discharge hole, that is, in the vicinity of the treatment space. Therefore, the gas supply system can supply and control the first gas with good responsiveness through the first diaphragm valves, and can perform high-speed switching between a case where only the second gas is supplied to the treatment space and a case where a mixed gas of the first gas and the second gas is supplied to the treatment space. Thus, the gas supply system 1 can improve the response speed of a process gas, and also further improve the switching speed of the process gas. Further, the gas supply system can control the supply and stop of the first gas for each first gas discharge hole.

In an exemplary embodiment, the first flow channel may have a supply port to which the first gas is supplied and an exhaust port from which the first gas is exhausted, and extends from the supply port to the exhaust port. The gas supply system may further include: a control valve, provided upstream of the supply port, which controls the first gas supplied to the supply port at a predetermined pressure; a plurality of first orifices which are each provided between the first flow channel and the first gas discharge hole to correspond to the first gas discharge hole; and a first controller that brings the control valve and the plurality of first diaphragm valves into operation, and each first diaphragm valve may control a supply timing of the first gas supplied from an outlet of the first orifice to the first gas discharge hole.

In this case, the first gas is supplied to the first flow channel at a predetermined pressure by the control valve, and circulates from the supply port of the first flow channel to the exhaust port. The first gas is supplied from the outlets of the first orifices to the first gas discharge hole by switching of the first diaphragm valves. Therefore, the gas supply system can stabilize the pressure of the first flow channel in the entire flow channel, and branch the first gas from each of a plurality of points of the first flow channel of which the pressure is stabilized. Thus, the gas supply system can reduce a pressure error for each first gas discharge hole. In addition, the gas supply system includes the first orifices corresponding to the first gas discharge hole, and thus it is possible to suppress a fluctuation in pressure within the first flow channel due to switching of the first diaphragm valves.

In an exemplary embodiment, the gas supply system may further include a first pressure detector that detects a pressure of the first gas in a flow channel between the control valve and the supply port, and the control valve may control the pressure of the first gas on the basis of a detection result of the first pressure detector. In this case, the gas supply system can control the pressure of the first gas supplied to the first flow channel on the basis of the downstream pressure of the control valve.

In an exemplary embodiment, the gas supply system may further include a second pressure detector that detects the pressure of the first gas exhausted from the exhaust port, and the first controller may calculate the pressure of the first gas at an arrangement position of each first orifice on the basis of a detection result of the first pressure detector and a detection result of the second pressure detector, and control a supply timing of the first gas through each first diaphragm valve on the basis of a result of calculation of the pressure. In this case, the gas supply system can predict the pressure of the first gas at the arrangement position of each of the first orifices, and thus it is possible to improve the accuracy of the flow rate of the first gas supplied from each first gas discharge hole.

In an exemplary embodiment, the gas supply system may further include an exhaust orifice provided in the exhaust port of the first flow channel. In this case, the gas supply system can suppress the differential pressure of the first gas dependent on a position within the first flow channel.

In an exemplary embodiment, the gas supply system may further include a temperature detector that detects a temperature of the first gas in the first flow channel, and the control valve may control a flow rate of the first gas on the basis of a detection result of the temperature detector. In this case, the gas supply system can adjust a flow rate in consideration of a change in the flow rate of the first gas with a change in temperature.

In an exemplary embodiment, each of the first diaphragm valves may include a piezoelectric element that drives a diaphragm, the gas supply system may further include a detector that measures an amount of displacement of the piezoelectric element, and the first controller may control a degree of opening of the first diaphragm valve using the amount of displacement as a parameter. In this case, the gas supply system can suppress a control error of the degree of opening of the first diaphragm valve, as compared with a case where a control voltage is used as a parameter.

In an exemplary embodiment, the gas supply system may further include a plurality of second diaphragm valves which are each provided between the second flow channel and the second gas discharge hole to correspond to the second gas discharge hole. In this case, the amount of supply of the second gas in each second gas discharge hole is controlled by the second diaphragm valve. Thus, the gas supply system can control supply from the first flow channel and supply from the second flow channel independently of each other.

In an exemplary embodiment, the gas supply system may further include: a first gas box that has a plurality of gas sources including the first gas source, and supplies a first mixed gas, obtained from the plurality of gas sources, to the first flow channel; a first flow rate controller provided between the first gas box and the first flow channel; a second gas box that has a plurality of gas sources including the second gas source, and supplies a second mixed gas, obtained from the plurality of gas sources, to the second flow channel; a second flow rate controller provided between the second gas box and the second flow channel; and a second controller that brings the plurality of first diaphragm valves and the plurality of second diaphragm valves into operation. The first flow channel may be a closed space to which the first mixed gas is supplied, the second flow channel may be a closed space to which the second mixed gas is supplied, and the second controller may bring each of the first diaphragms into operation so that a flow rate of the first mixed gas within the first flow channel is distributed and controlled for each of the first gas discharge holes, and bring each of the second diaphragms into operation so that a flow rate of the second mixed gas within the second flow channel is distributed and controlled for each of the second gas discharge holes.

In this case, the first mixed gas including the first gas is controlled by the first flow rate controller to a predetermined flow rate, and is supplied to the first flow channel. Each of the first diaphragms is operated by the second controller. Thereby, the first mixed gas having a predetermined flow rate within the first flow channel is distributed and controlled for each first gas discharge hole. The second mixed gas including the second gas is controlled by the second flow rate controller to a predetermined flow rate, and is supplied to the second flow channel. Each of the second diaphragms is operated by the second controller. Thereby, the second mixed gas within the second flow channel is distributed and controlled for each second gas discharge hole. In this manner, the gas supply system can distribute and control a flow rate for each discharge hole.

In an exemplary embodiment, the gas supply system may further include: a third pressure detector that measures a pressure of the first mixed gas supplied to the first flow channel; and a fourth pressure detector that measures a pressure of the second mixed gas supplied to the second flow channel, and the second controller may control degrees of opening of the plurality of first diaphragm valves on the basis of a relationship between a flow rate, a pressure and a degree of valve opening acquired in advance for each of the first gas discharge holes, a measurement result of the third pressure detector, and a target flow rate which is set for each of the first gas discharge holes, and control degrees of opening of the plurality of second diaphragm valves on the basis of a relationship between a flow rate, a pressure and a degree of valve opening acquired in advance for each of the second gas discharge holes, a measurement result of the fourth pressure detector, and a target flow rate which is set for each of the second gas discharge holes. In this case, the gas supply system can control the degrees of opening of the first diaphragm valve and the second diaphragm valve using a relationship acquired in advance.

In an exemplary embodiment, each of the first diaphragm valves and each of the second diaphragm valves may include a piezoelectric element that drives a diaphragm, the gas supply system may further include a detector that measures an amount of displacement of the piezoelectric element, and the second controller may control a degree of opening of the first diaphragm valve and a degree of opening of the second diaphragm valve using the amount of displacement as a parameter. In this case, the gas supply system can suppress control errors of the degrees of opening of the first diaphragm valve and the second diaphragm valve, as compared with a case where a control voltage is used as a parameter.

In a second aspect, there is provided a gas supply method in a gas supply system that supplies a gas to a treatment space within a treatment container of a substrate treatment apparatus. The gas supply system includes a first flow channel, a plurality of first gas discharge hole, a second flow channel, a second gas discharge hole, a plurality of first orifices, a plurality of first diaphragm valves, and a control valve. The first flow channel, formed inside a ceiling or a sidewall of the treatment container, connects to a first gas source of a first gas. The first flow channel has a supply port to which the first gas is supplied and an exhaust port from which the first gas is exhausted, extends from the supply port to the exhaust port, and communicates with the treatment space through the plurality of first gas discharge holes. The second flow channel, formed inside the ceiling or the sidewall of the treatment container, connects to a second gas source of a second gas and communicates with the treatment space through the second gas discharge hole. The plurality of first orifices is provided between the first flow channel and the first gas discharge hole to correspond to the first gas discharge hole. Each of the first diaphragm valves is provided between the first flow channel and the first gas discharge hole to correspond to the first gas discharge hole, and controls a supply timing of the first gas supplied from an outlet of the first orifice to the treatment space. The control valve is provided upstream of the supply port, and controls a flow rate of the first gas from the supply port to the exhaust port to a predetermined flow rate. The gas supply method includes: a step of setting each of the first diaphragm valves to be closed and supplying the second gas from the second gas discharge hole to the treatment space, in a state where the first gas is circulated at a predetermined flow rate from the supply port of the first flow channel to the exhaust port; and a step of setting the at least one first diaphragm valve to be opened and supplying the second gas from the second gas discharge hole to the treatment space, in a state where the first gas is circulated at a predetermined flow rate from the supply port of the first flow channel to the exhaust port.

According to this gas supply method, it is possible to continue to supply the second gas, for example, as a main gas to the treatment space, and to intermittently supply the first gas, for example, as an additive gas at high speed to the treatment space. Therefore, in the gas supply method, it is possible to improve the response speed of a process gas, and to further improve the switching speed of the process gas.

In a third aspect, there is provided a gas supply method in a gas supply system that supplies a gas to a treatment space within a treatment container of a substrate treatment apparatus. The gas supply system includes a first gas box, a first flow rate controller, a first flow channel, a plurality of first gas discharge holes, a plurality of first diaphragm valves, a second gas box, a second flow rate controller, a second flow channel, a plurality of second gas discharge holes, and a plurality of second diaphragm valves. The first gas box has a plurality of gas sources, and supplies a first mixed gas obtained from the plurality of gas sources. The first flow rate controller is provided on a downstream side of the first gas box. The first flow channel is a closed space, formed inside a ceiling or a side-wall of the treatment container, connects to the first flow rate controller, to which the first mixed gas is supplied, and communicates with the treatment space through the plurality of first gas discharge holes. Each of the first diaphragm valves is provided between the first flow channel and the first gas discharge hole to correspond to the first gas discharge hole. The second gas box has a plurality of gas sources, and supplies a second mixed gas obtained from the plurality of gas sources. The second flow rate controller is provided on a downstream side of the second gas box. The second flow channel is a closed space, formed inside the ceiling or the sidewall of the treatment container, connects to the second flow rate controller, to which the second mixed gas is supplied, and communicates with the treatment space through the plurality of second gas discharge holes. Each of the second diaphragm valves is provided between the second flow channel and the second gas discharge hole to correspond to the second gas discharge hole. The gas supply method includes: a step of setting the first diaphragm valve to be opened and setting the second diaphragm valve to be closed; and a step of setting the first diaphragm valve to be closed and setting the second diaphragm valve to be opened.

According to this gas supply method, it is possible to improve the response speed of a process gas, and to further improve the switching speed of the process gas.

According to various aspects and exemplary embodiments of the present disclosure, it is possible to provide a gas supply system enhanced to control a plurality of gases and execute a process.

Hereinafter, various exemplary embodiments will be described in detail with reference to the accompanying drawings. In the respective drawings, the same or equivalent portions are denoted by the same reference numerals and signs.

First Exemplary Embodiment

[Outline of Gas Supply System]

FIG. 1 is a schematic diagram of a gas supply system 1 according to a first exemplary embodiment. FIG. 1 shows the gas supply system 1 that supplies gases to a treatment space within a chamber 12 (an example of a treatment container) of a substrate treatment apparatus. The gas supply system 1 includes a first gas source GS1 and a second gas source GS2. The first gas source GS1 stores a first gas. The second gas source GS2 stores a second gas. The first gas and the second gas are arbitrary. As an example, the second gas may be a main gas of a process, and the first gas may be an additive gas of the process.

The gas supply system 1 includes a first main flow channel L10 and a second main flow channel L20. The first main flow channel L10 connects the first gas source GS1 and a first low channel L1 of a chamber 12 through a supply port IN1. The second main flow channel L20 connects the second gas source GS2 of the second gas and a second flow channel L2 of the chamber 12 through a supply port IN4. The first main flow channel L10 and the second main flow channel L20 are formed by, for example, piping.

The first flow channel L1 is connected to the first gas source GS1, and is formed inside an upper electrode (an example of a ceiling) of the chamber 12 or inside a sidewall of the chamber 12. The first flow channel L1 has the supply port IN1 to which the first gas is supplied and an exhaust port OT1 from which the first gas is exhausted, and extends from the supply port IN1 to the exhaust port OT1. The exhaust port OT1 is connected to an exhaust apparatus 51 that exhausts the chamber 12 through an exhaust flow channel EL.

The first flow channel L1 and the treatment space within the chamber 12 communicate with each other through a plurality of first gas discharge holes described later. The first gas is supplied from the plurality of first gas discharge holes connected to the first flow channel L1 to the treatment space of the chamber 12.

A first diaphragm valve is provided between the first flow channel L1 and each of the first gas discharge holes to correspond to the first gas discharge hole. That is, the gas supply system 1 includes a plurality of first diaphragm valves corresponding to the plurality of first gas discharge holes. As an example, FIG. 1 shows four first diaphragm valves DV1 to DV4 corresponding to four first gas discharge holes. The four first diaphragm valves DV1 to DV4 can operate independently with each other. An example of the first diaphragm valve is an ON/OFF valve. The details of the first diaphragm valve will be described later. The number of first gas discharge holes may be two or more without being limited to four. In addition, the plurality of first diaphragm valves are not limited in number to four, and may be provided to correspond to the plurality of first gas discharge holes.

A first orifice may be provided between the first flow channel L1 and each of the first gas discharge holes to correspond to the first gas discharge hole. The first orifice is disposed further upstream than the first diaphragm valve. As an example, FIG. 1 shows four first orifices OL1 to OL4. Each of the first diaphragm valves controls a supply timing of the first gas supplied from the outlet of the first orifice to the first gas discharge hole. A plurality of first orifices is not limited in number to four, and may be provided to correspond to the plurality of first gas discharge holes.

The second flow channel L2 is connected to the second gas source GS2, and is formed inside the upper electrode of the chamber 12 or inside the sidewall of the chamber 12. The second flow channel L2 is a closed space, and is connected to a plurality of second discharge holes described later. The second gas is supplied from the plurality of second discharge holes connected to the second flow channel L2 to the treatment space of the chamber 12.

The gas supply system 1 may include a pressure type flow rate control apparatus FC2. The pressure type flow rate control apparatus FC2 is disposed on the downstream side of the second gas source GS2 in the second main flow channel L20. A primary valve VL4 is provided on the upstream side of the pressure type flow rate control apparatus FC2, and a secondary valve VL5 is provided on the downstream side of the pressure type flow rate control apparatus FC2. Meanwhile, the flow rate control apparatus may be a thermal type flow rate control apparatus or a flow rate control apparatus based on other principles without being limited to the pressure type flow rate control apparatus.

The second gas of the second gas source GS2 has the flow rate and pressure adjusted by the pressure type flow rate control apparatus FC2, and is supplied to the second flow channel L2 of the chamber 12 through the supply port IN4.

The gas supply system 1 may include a control valve VL1. The control valve VL1 is disposed on the downstream side of the first gas source GS1 in the first main flow channel L10. The control valve VL1 is provided upstream of the supply port IN1, and controls the first gas supplied to the supply port IN1 at a predetermined pressure. The control valve VL1 has the same function as that of a control valve included in the pressure type flow rate control apparatus FC2. A first pressure detector PM1 may be disposed in a flow channel between the control valve VL1 and the supply port IN1.

As an example, the control valve VL1 controls the flow rate of the first gas on the basis of the detection result of the first pressure detector PM1. As a more specific example, a control circuit C1 determines the operation of the control valve VL1. The control circuit C1 inputs a pressure detected by the first pressure detector PM1, and calculates a flow rate at the detected pressure. The control circuit C1 compares a set target flow rate with the calculated flow rate, and determines the operation of the control valve VL1 so that a difference therebetween decreases. Meanwhile, the primary valve may be provided between the first gas source GS1 and the control valve VL1. The secondary valve may be provided downstream of the control valve VL1, and upstream of the first pressure detector PM1. In addition, the control circuit C1 and the control valve VL1 may be unitized as a unit U1.

The gas supply system 1 may further include a second pressure detector PM2 that detects the pressure of the first gas exhausted from the exhaust port OT1. In this case, as an example, the control valve VL1 controls the flow rate of the first gas on the basis of the detection results of the first pressure detector PM1 and the second pressure detector PM2. More specifically, the pressure of the first gas at the arrangement position of each first orifice is calculated on the basis of the detection result of the first pressure detector PM1 and the detection result of the second pressure detector PM2. The supply timing of the first gas is controlled by each first diaphragm valve on the basis of the result of calculation of pressure.

The gas supply system 1 may include a temperature detector that detects the temperature of the first gas in the first flow channel L1. In this case, the control valve VL1 performs flow rate correction using the temperature detector, similarly to the control valve included in the pressure type flow rate control apparatus FC2. Specifically, the control valve VL1 controls the flow rate of the first gas on the basis of the detection result of the temperature detector.

The first gas of the first gas source GS1 has the flow rate and pressure adjusted by the control valve VL1, and is supplied to the first flow channel L1 of the chamber 12 through the supply port IN1. Meanwhile, the exhaust port OT1 of the first flow channel L1 may be provided with an exhaust orifice OL9.

The gas supply system 1 includes a controller C2 (an example of a first controller) that brings the control valve VL1 and a plurality of first diaphragm valves DV1 to DV4 into operation. The controller C2 is a computer including a processor, a storage unit, an input device, a display device, and the like. The controller C2 inputs a recipe stored in the storage unit, and outputs a signal to the control circuit C1 that brings the control valve VL1 into operation. In addition, the controller C2 inputs the recipe stored in the storage unit, and controls the switching operations of the plurality of first diaphragm valves DV1 to DV4. In addition, the controller C2 may operate the exhaust apparatus 51 through the control circuit C1.

[First Diaphragm Valve]

Figure 2:
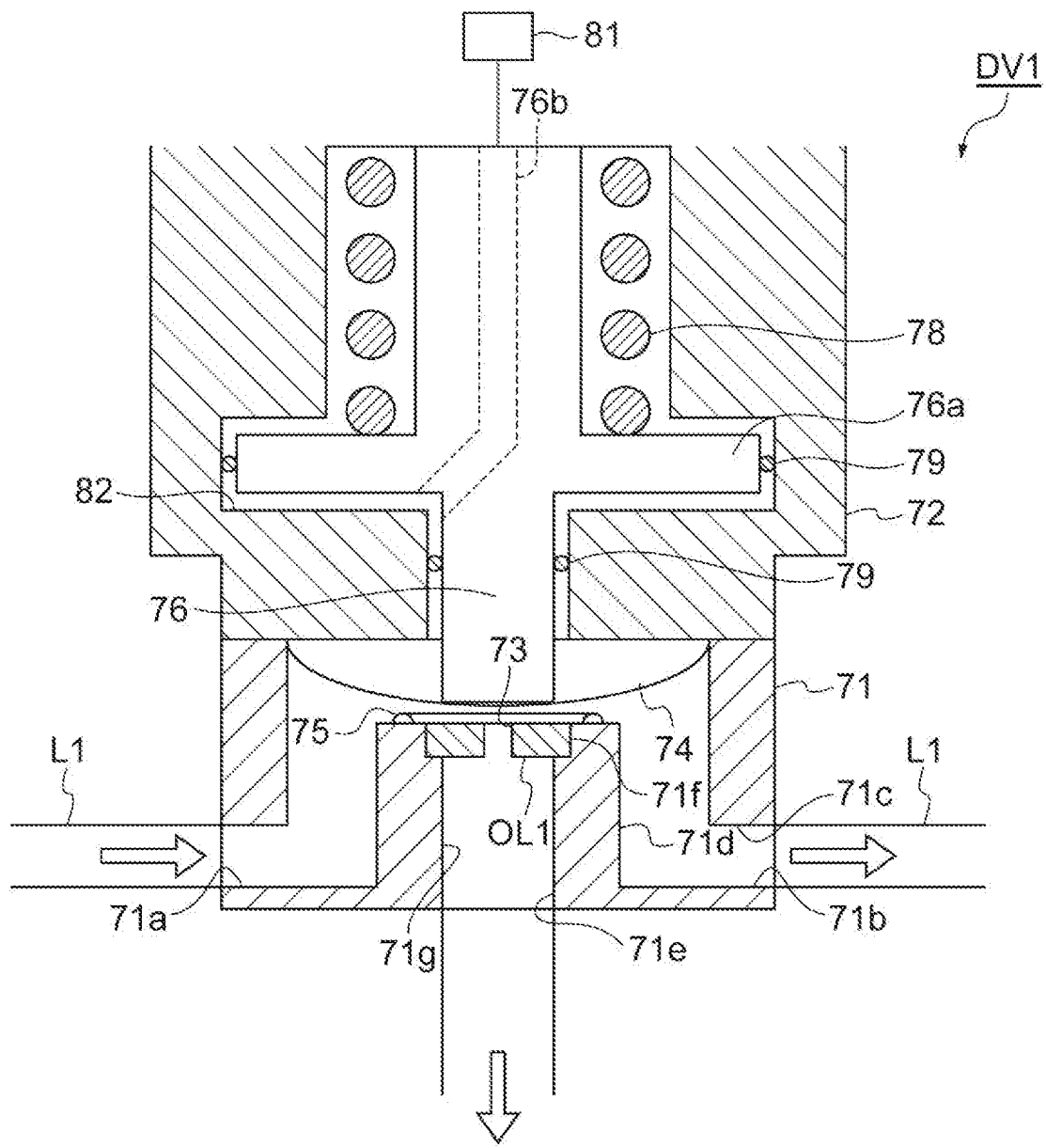
FIG. 2 is a cross-sectional view schematically illustrating a first diaphragm valve.

Since the plurality of first diaphragm valves DV1 to DV4 are configured to be the same as each other, the first diaphragm valve DV1 will be described below by way of example. FIG. 2 is a cross-sectional view schematically illustrating the first diaphragm valve DV1. The first diaphragm valve DV1 is disposed on the first flow channel L1. As shown in FIG. 2, the first diaphragm valve DV1 includes a lower main body 71 and an upper main body 72. A sealing member 74 exhibiting a valve function is disposed between the lower main body 71 and the upper main body 72. The lower main body 71 has a flow channel for circulating a gas formed therein. The upper main body 72 includes a component that brings the sealing member 74 into operation. The sealing member 74 may be constituted by a member having flexibility. The sealing member 74 may be, for example, an elastic member, a diaphragm, a bellows, or the like.

The lower main body 71 has a flow channel serving as a portion of the first flow channel L1 formed therein. As a specific example, the lower main body 71 has an inlet 71a and an outlet 71b, and has an internal flow channel 71c extending from the inlet 71a to the outlet 71b.

An orifice support portion 71d for supporting the first orifice OL1 is formed within the internal flow channel 71c. The orifice support portion 71d protrudes from the inner wall of the internal flow channel 71c toward the upper main body 72 side (sealing member 74 side) of the internal flow channel 71c. The orifice support portion 71d has an inlet 71e and an outlet 71f, and has an internal flow channel 71g extending from the inlet 71e to the outlet 71f. The first orifice OL1 is provided on the outlet 71f of the orifice support portion 71d. A seal portion 75 protruding to the upper main body 72 side (sealing member 74 side) rather than the first orifice OL1 is provided in the vicinity of the first orifice OL1.

The upper main body 72 includes a component that controls a distance between the sealing member 74 and the first orifice OL1. As a specific example, the upper main body 72 includes a cylinder 76, an urging member 78 and a driving portion 81.

The cylinder 76 fixedly supports the sealing member 74, and is housed inside the upper main body 72. For example, the cylinder 76 fixes the sealing member 74 to the lower end thereof. The cylinder 76 includes a protruding portion 76a of which the diameter is expanded toward the outer side. The cylinder 76 includes a flow channel 76b therein. A seal member 79 is provided between the lateral side of the protruding portion 76a and the inner wall of the upper main body 72, and between the lateral side of the cylinder 76 which is located further downward than the protruding portion 76a and the inner wall of the upper main body 72. A space 82 is formed by the inner wall of the upper main body 72, the sidewall of the cylinder 76, the lower surface of the protruding portion 76a, and the seal member 79. The flow channel 76b of the cylinder 76 communicates with the space 82.

The urging member 78 elastically urges the cylinder 76 in a direction in which the sealing member 74 is pressed against the first orifice OL1. For example, the cylinder 76 is urged against the lower main body 71 side (first orifice OL1 side). More specifically, the urging member 78 gives an urging force to the upper surface of the protruding portion 76a of the cylinder 76 downward. The sealing member 74 is pressed against the first orifice OL1 by the urging member 78 to seal the outlet 73 of the first orifice OL1. In this manner, the second flow channel is closed by the action of the urging member 78 (closing control). The urging member 78 is constituted by, for example, an elastic body. As a specific example, the urging member 78 is a spring.

The driving portion 81 moves the cylinder 76 in a direction opposite to the pressed direction. The driving portion 81 supplies air to the flow channel 76b of the cylinder 76, and fills air into the space 82. In a case where the pressure of the air filled into the space 82 becomes larger than the urging force of the urging member 78, the cylinder 76 rises together with the sealing member 74. That is, the sealing member 74 is separated from the first orifice OL1 by the driving portion 81. In this manner, the second flow channel is opened by the driving portion 81 (opening control).

Figure 3:
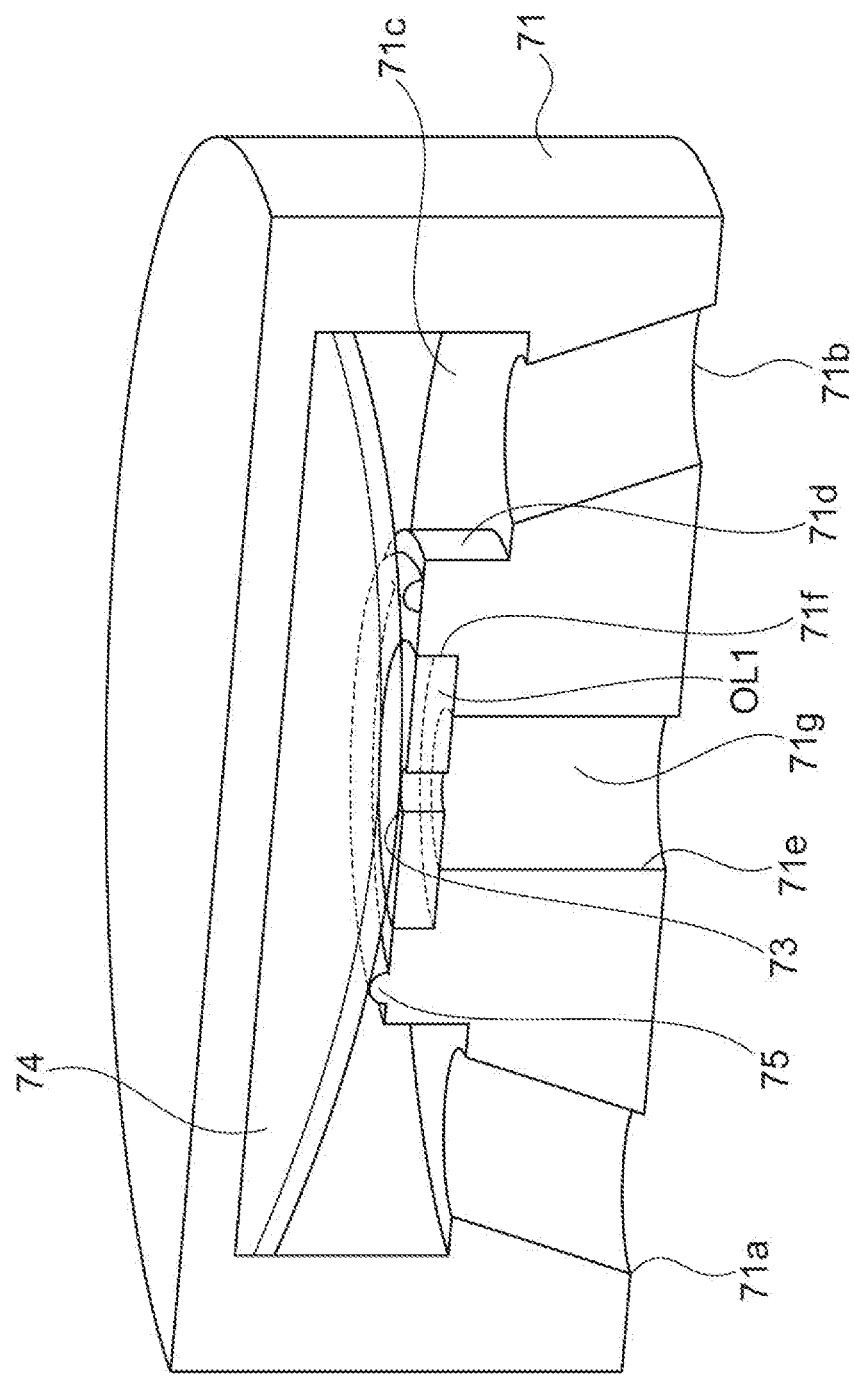
FIG. 3 is a diagram schematically illustrating a lower structure of the first diaphragm valve.

The internal flow channel 71c of the lower main body 71 has a structure in which the channel is not blocked by the operation of the sealing member 74. That is, the first flow channel L1 is not blocked by the operation of the sealing member 74, and is in a state of communicating at all times. FIG. 3 is a diagram schematically illustrating a lower structure of the first diaphragm valve DV1. As shown in FIG. 3, the internal flow channel 71c is formed to surround the periphery of the orifice support portion 71d. The first gas passes through the lateral portion of the orifice support portion 71d when the sealing member 74 is pressed against the first orifice OL1, and passes through the lateral portion and upper portion of the orifice support portion 71d when the sealing member 74 is separated from the first orifice OL1. In this manner, the sealing member 74 realizes switching without influencing the circulation of the first flow channel L1.

Meanwhile, the above-described first diaphragm valve DV1 is an example, and can be variously changed. For example, the protruding direction of the sealing member 74 may be reversed. In addition, the motive power of the first diaphragm valve DV1 may be a piezoelectric element.

[Substrate Treatment Apparatus]

Figure 4:
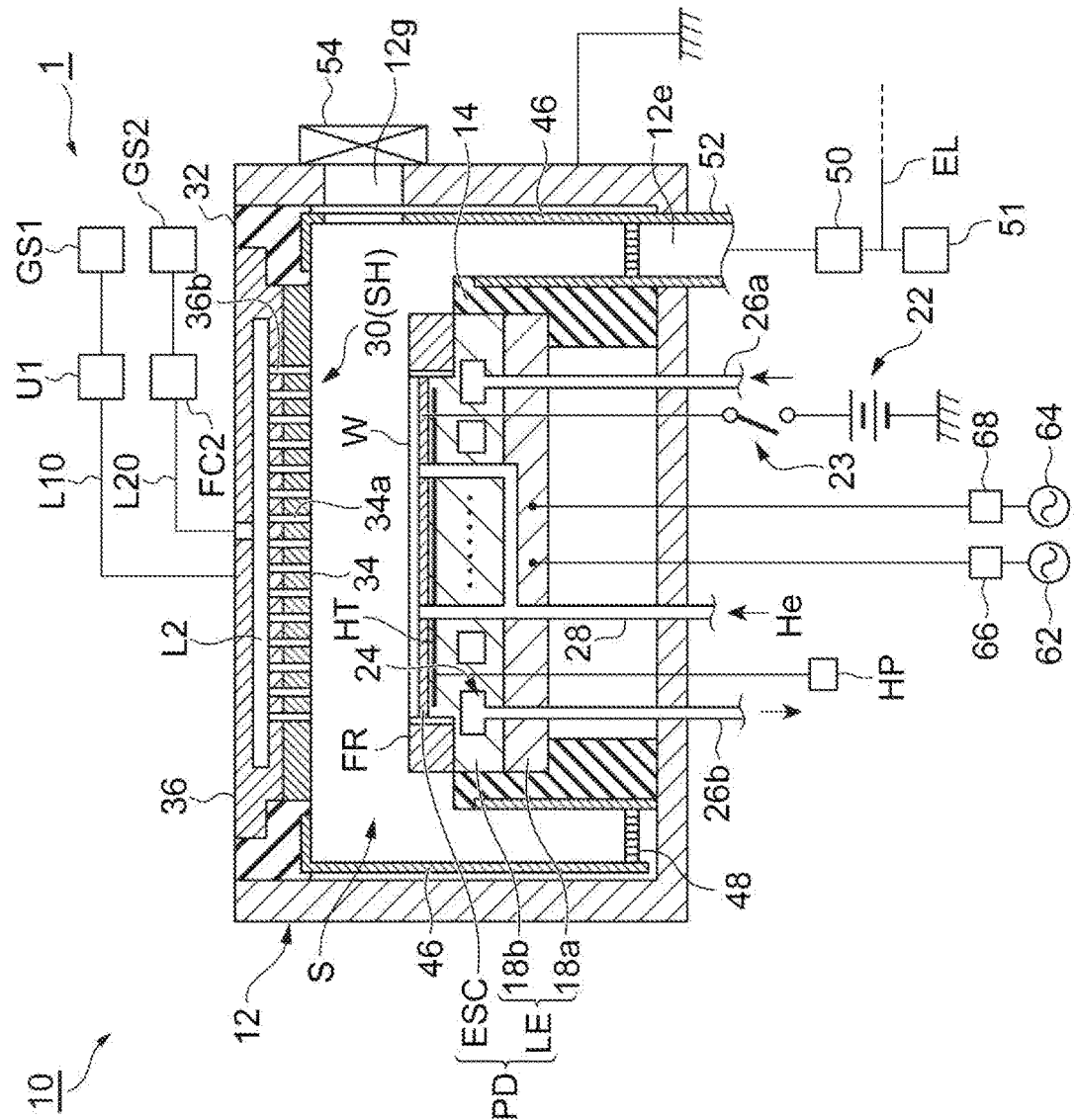
FIG. 4 is a cross-sectional view schematically illustrating a substrate treatment system according to the first exemplary embodiment.

As a substrate treatment apparatus (substrate treatment system) including the gas supply system 1, a plasma treatment apparatus of an exemplary embodiment will be described. FIG. 4 is a diagram schematically illustrating a plasma treatment apparatus according to an exemplary embodiment. A plasma treatment apparatus 10 shown in FIG. 4 is a capacitive coupling type plasma treatment apparatus for plasma etching.

The plasma treatment apparatus 10 includes the chamber 12. The chamber 12 has a substantially cylindrical shape. The chamber 12 is constituted of, for example, aluminum, and has anodic oxidation performed on the inner wall surface thereof. This chamber 12 is grounded by security. In addition, a grounded conductor 12a is mounted on the upper end of the sidewall of the chamber 12 to extend from the sidewall upward. The grounded conductor 12a has a substantially cylindrical shape. In addition, a carrying-in outlet 12g of a substrate (hereinafter, referred to as a "wafer W") is provided on the sidewall of the chamber 12, and this carrying-in outlet 12g is configured to be capable of being switched by a gate valve 54.

A support portion 14 of a substantially cylindrical shape is provided on the bottom of the chamber 12. The support portion 14 is constituted of, for example, an insulating material. The support portion 14 extends from the bottom of the chamber 12 in a vertical direction, within the chamber 12. In addition, a placing table PD is provided within the chamber 12. The placing table PD is supported by the support portion 14.

The placing table PD holds the wafer W on the upper surface thereof. The placing table PD includes a lower electrode LE and an electrostatic chuck ESC. The lower electrode LE includes a first plate 18a and a second plate 18b. The first plate 18a and the second plate 18b are constituted of a metal such as, for example, aluminum, and have a substantially discoid shape. The second plate 18b is provided on the first plate 18a, and is electrically connected to the first plate 18a.

The electrostatic chuck ESC is provided on the second plate 18b. The electrostatic chuck ESC has a structure in which an electrode which is a conductive film is disposed between a pair of insulating layers or insulating sheets. A direct-current power source 22 is electrically connected to the electrode of the electrostatic chuck ESC through a switch 23. This electrostatic chuck ESC adsorbs the wafer W using an electrostatic force such as a Coulomb's force generated by a direct-current voltage from the direct-current power source 22. Thereby, the electrostatic chuck ESC can hold the wafer W.

A focus ring FR is disposed on the peripheral edge of the second plate 18b to surround the edge of the wafer W and the electrostatic chuck ESC. The focus ring FR improves the uniformity of plasma treatment. The focus ring FR may be constituted of a material such as, for example, silicon, quartz, or SiC.

A refrigerant flow channel 24 is provided within the second plate 18b. The refrigerant flow channel 24 constitutes a temperature-adjusting mechanism. A refrigerant is supplied to the refrigerant flow channel 24 from a chiller unit provided outside the chamber 12 through piping 26a. The refrigerant supplied to the refrigerant flow channel 24 is returned to the chiller unit through the piping 26b. In this manner, the refrigerant is supplied to the refrigerant flow channel 24 to be circulated. The temperature of this refrigerant is controlled, and thus the temperature of the wafer W supported by the electrostatic chuck ESC is controlled.

In addition, the plasma treatment apparatus 10 is provided with a gas supply line 28. The gas supply line 28 supplies a heat-transfer gas from a heat-transfer gas supply mechanism, for example, a He gas between the upper surface of the electrostatic chuck ESC and the rear surface of the wafer W.

In addition, the plasma treatment apparatus 10 is provided with a heater HT which is a heating element. The heater HT is buried within, for example, the second plate 18b. A heater power source HP is connected to the heater HT. By supplying power supplied from the heater power source HP to the heater HT, the temperature of the placing table PD is adjusted, and the temperature of the wafer W placed on the placing table PD is adjusted. Meanwhile, the heater HT may be built into the electrostatic chuck ESC.

In addition, the plasma treatment apparatus 10 includes an upper electrode 30. The upper electrode 30 is a ceiling member constituting the ceiling of the chamber 12. The upper electrode 30 is disposed to be opposite to the placing table PD, on the upper portion of the placing table PD. The lower electrode LE and the upper electrode 30 are provided substantially in parallel to each other. A treatment space S for performing plasma treatment on the wafer W is provided between the upper electrode 30 and the placing table PD.

The upper electrode 30 is supported on the upper portion of the chamber 12 with an insulating shielding member 32 interposed therebetween. In an exemplary embodiment, the upper electrode 30 may be configured such that a distance in a vertical direction from the upper surface of the placing table PD, that is, a wafer placement surface is variable. The upper electrode 30 may include a top plate 34 and a support 36. The top plate 34 faces the treatment space S, and the top plate 34 is provided with a plurality of gas discharge holes. The gas discharge hole includes a first gas discharge hole and a second gas discharge hole. Meanwhile, in FIG. 4, only the second gas discharge hole 34a is shown. This top plate 34 may be constituted of silicon or a silicon oxide. Alternatively, the top plate 34 may be formed by coating a conductive (for example, aluminum) base material with ceramics. The details of the upper electrode 30 will be described later.

The support 36 detachably supports the top plate 34, and may be constituted of a conductive material such as, for example, aluminum. This support 36 may have a water-cooling structure. The first flow channel L1 and the second flow channel L2 are provided inside the support 36. Meanwhile, FIG. 4 shows only the second flow channel L2. The first main flow channel L10 of the gas supply system 1 is connected to the first flow channel L1. The second main flow channel L20 of the gas supply system 1 is connected to the second flow channel L2. The details of the first flow channel L1 and the second flow channel L2 will be described later.

A plurality of communication holes for connecting the first flow channel L1 and the plurality of gas discharge holes extending downward of the first flow channel L1 are formed in the support 36. A plurality of communication holes 36b for connecting the second flow channel L2 and a plurality of second gas discharge holes 34a extending downward of the second flow channel L2 are formed in the support 36. The upper electrode 30 having such a configuration constitutes a shower head SH.

In addition, in the plasma treatment apparatus 10, a deposit shield 46 is detachably provided along the inner wall of the chamber 12. The deposit shield 46 is also provided on the outer circumference of the support portion 14. The deposit shield 46 is used for preventing by-products (deposits) of plasma treatment from being attached to the chamber 12, and may be formed by covering an aluminum material with ceramics such as $Y_2O_3$.

An exhaust plate 48 is provided on the bottom side of the chamber 12, and between the support portion 14 and the sidewall of the chamber 12. The exhaust plate 48 may be formed by covering, for example, an aluminum material with ceramics such as $Y_2O_3$. A large number of through-holes are formed in the exhaust plate 48. The lower portion of this exhaust plate 48 and the chamber 12 are provided with an exhaust port 12e. An exhaust apparatus 50 and an exhaust apparatus 51 are connected to the exhaust port 12e through an exhaust pipe 52. In an exemplary embodiment, the exhaust apparatus 50 is a turbo-molecular pump, and the exhaust apparatus 51 is a dry pump. The exhaust apparatus 50 is provided further upstream than the exhaust apparatus 51 with respect to the chamber 12. The exhaust flow channel EL of the gas supply system 1 is connected to piping between the exhaust apparatus 50 and the exhaust apparatus 51. The exhaust flow channel EL is connected between the exhaust apparatus 50 and the exhaust apparatus 51, and thus the backflow of a gas from the exhaust flow channel EL into the chamber 12 is suppressed.

In addition, the plasma treatment apparatus 10 further includes a first radio-frequency power source 62 and a second radio-frequency power source 64. The first radio-frequency power source 62 generates a first radio frequency for plasma generation, and generates a frequency of 27 to 100 MHz or a radio frequency of 40 MHz in an example. The first radio-frequency power source 62 is connected to the lower electrode LE with a matching device 66 interposed therebetween. The matching device 66 includes a circuit for matching output impedance of the first radio-frequency power source 62 with input impedance on the load side (lower electrode LE side).

The second radio-frequency power source 64 generates a second radio frequency for attracting ions to the wafer W, that is, a radio frequency for a bias, and generates a frequency in a range of 400 kHz to 13.56 MHz, or a second radio frequency of 3.2 MHz in an example. The second radio-frequency power source 64 is connected to the lower electrode LE with a matching device 68 interposed therebetween. The matching device 68 includes a circuit for matching output impedance of the second radio-frequency power source 64 with input impedance on the load side (lower electrode LE side).

In addition, in an exemplary embodiment, the controller C2 shown in FIG. 1 controls each portion of the plasma treatment apparatus 10 to perform plasma treatment executed in plasma treatment apparatus 10.

This plasma treatment apparatus 10 can generate plasma by exciting a gas supplied into the chamber 12. The wafer W can be processed by active species. In addition, while the second gas is supplied by the gas supply system 1, for example, at a second flow rate, the first gas can be supplied into the chamber 12 intermittently with good responsiveness at a first flow rate smaller than the second flow rate. Therefore, it is possible to enhance the throughput of a process of alternately performing different plasma treatments on the wafer W.

[Details of Upper Electrode]

Figure 5:
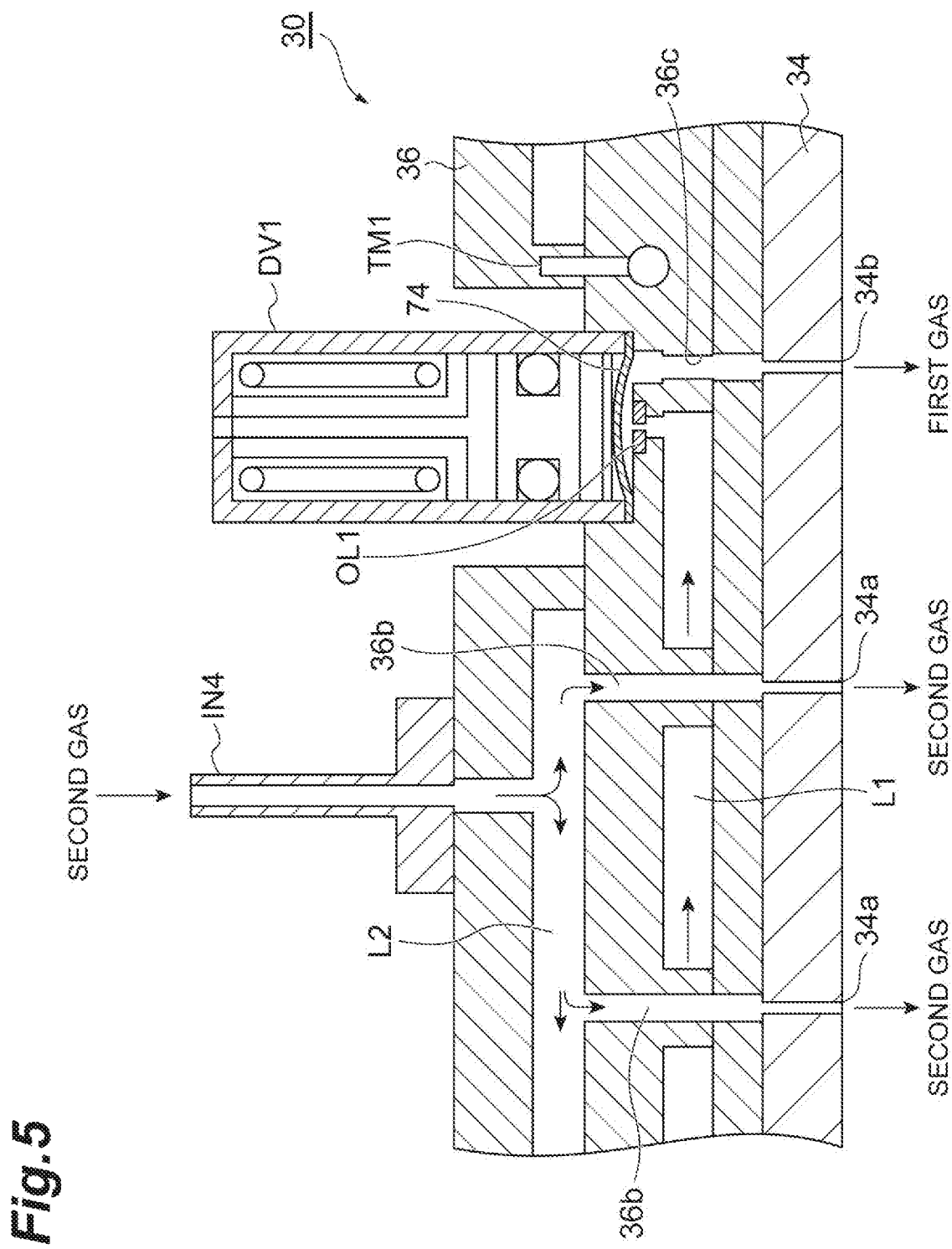
FIG. 5 is a schematic cross-sectional view of an upper electrode in FIG. 4.

FIG. 5 is a schematic cross-sectional view of the upper electrode 30 in FIG. 4. As shown in FIG. 5, the first flow channel L1 and the second flow channel L2 that extend in a horizontal direction are provided inside the support 36 of the upper electrode 30. The first flow channel L1 is located below the second flow channel L2.

A plurality of communication holes 36c for connecting the first flow channel L1 and a plurality of first gas discharge holes 34b extending downward of the first flow channel L1 are formed in the support 36. The first orifice OL1 and first diaphragm valve DV1 are provided between the first flow channel L1 and the first gas discharge hole 34b of the support 36. The first diaphragm valve DV1 in FIG. 5 protrudes the sealing member 74 of the first diaphragm valve DV1 in FIG. 2 in an opposite direction, but has the same function. The first gas flowing through the first flow channel L1 is supplied to the treatment space through the outlet of the first orifice OL1, the communication hole 36c, and the first gas discharge hole 34b when the first diaphragm valve DV1 is opened. Other first gas discharge holes 34b also have the same configuration. Meanwhile, the support 36 is provided with a temperature detector TM1 in order for the control valve VL1 to perform flow rate correction.

The plurality of communication holes 36b for connecting the second flow channel L2 and the plurality of second gas discharge holes 34a extending downward of the second flow channel L2 are formed in the support 36. The second gas is supplied through the supply port IN4, and is supplied to the treatment space through the plurality of communication holes 36b and the plurality of second gas discharge holes 34a.

Figure 6:
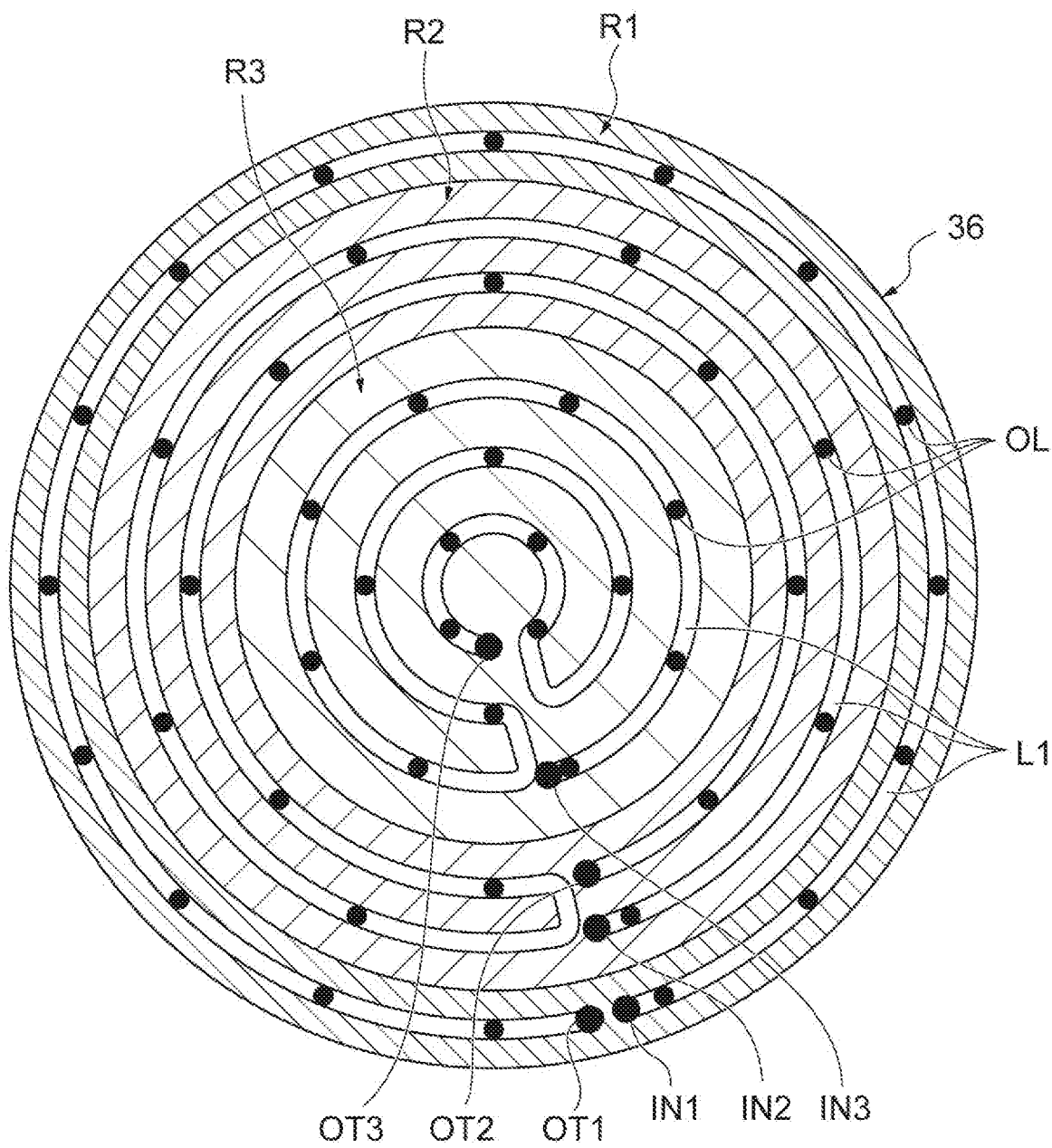
FIG. 6 is a schematic diagram when a first flow channel is seen in a plan view.

FIG. 6 is a schematic diagram when the first flow channel L1 is seen in a plan view. FIG. 6 shows three first flow channels L1 as an example. A plurality of orifices OL (first orifices) are provided in the first flow channel L1 to correspond to the plurality of first gas discharge holes 34b.

As an example, the support 36 has three regions outside from the center thereof. The most central region of the support is a third region R3, a second region R2 is located to surround the third region R3, and a first region R1 is located to surround the second region R2. The first flow channel L1 is formed in each of the regions. For example, in the first region R1, the first flow channel L1 extends from the supply port IN1 to the exhaust port OT1. In the second region R2, the first flow channel L1 extends from a supply port IN2 to an exhaust port OT2. In the third region R3, the first flow channel L1 extends from a supply port IN3 to an exhaust port OT3. Meanwhile, the number of regions included in the support 36 may be one or plural without being limited to three.

[Control of Controller]

The controller C2 inputs a recipe stored in the storage unit, and controls the switching operations of the plurality of first diaphragm valves. Since the first flow channel L1 extends from a supply port to an exhaust port, there is a concern that the pressure difference of the first gas occurs between a first gas discharge hole close to the supply port and a first gas discharge hole close to the exhaust port, depending on the length of the first flow channel L1. In this case, there is a concern that the amounts of supply of the first gas to the treatment space are different from each other for each first gas discharge hole. For this reason, the exhaust port OT1 of the first flow channel L1 is provided with the exhaust orifice OL9. Thereby, a few errors are present, but the pressure of the first flow channel L1 can be made substantially uniform without being dependent on its position.

However, in a case where it is necessary to eliminate the error of pressure dependent on a position, or a case where the gas supply system does not include the exhaust orifice OL9, the controller C2 performs control for canceling a pressure distribution dependent on a position. The controller C2 calculates (predicts) the pressure of the first gas at the arrangement position of each first orifice, on the basis of the comparison of the detection result of the first pressure detector PM1 provided upstream of the supply port with the detection result of the second pressure detector PM2 provided downstream of the exhaust port.

Figure 7:
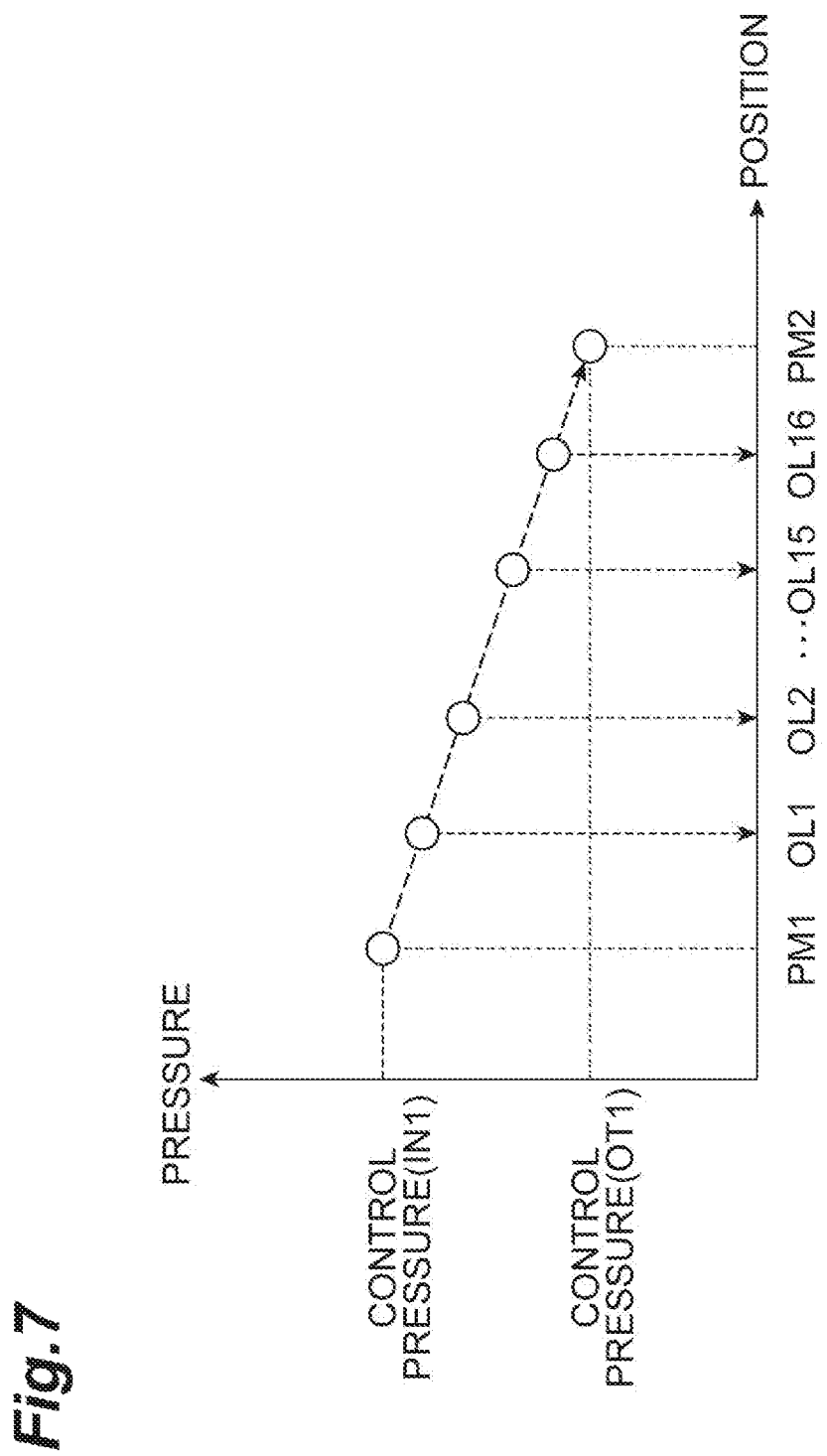
FIG. 7 is a graph illustrating a relationship between a control pressure and the position of an orifice in the first flow channel.

FIG. 7 is a graph illustrating a relationship between a control pressure and the position of an orifice in the first flow channel L1. The horizontal axis is the position of the orifice in a case where a coordinate axis is provided in the extending direction of the first flow channel L1, and the vertical axis is a control pressure. In the drawing, an example is shown in which sixteen orifices are disposed. The control pressure is a pressure targeted by the controller C2. As shown in FIG. 7, the control pressure in the supply port IN1 can be set to a pressure detected by the first pressure detector PM1 The control pressure in the exhaust port OT1 can be set to a pressure detected by the second pressure detector PM2. The controller C2 approximates a control pressure corresponding to a position within the first flow channel L1 as a linear pressure passing through the control pressure in the supply port IN1 and the control pressure in the exhaust port OT1. Since a position at which an orifice is disposed is well-known, the controller C2 can calculate the pressure of the first gas at the arrangement position of each first orifice, using the graph shown in FIG. 7. The controller C2 performs the switching control of the first diaphragm valve so that the flow rate of the first gas is set to a target flow rate written in a recipe, on the basis of the calculated pressure.

[Gas Supply Method]

Figure 8:
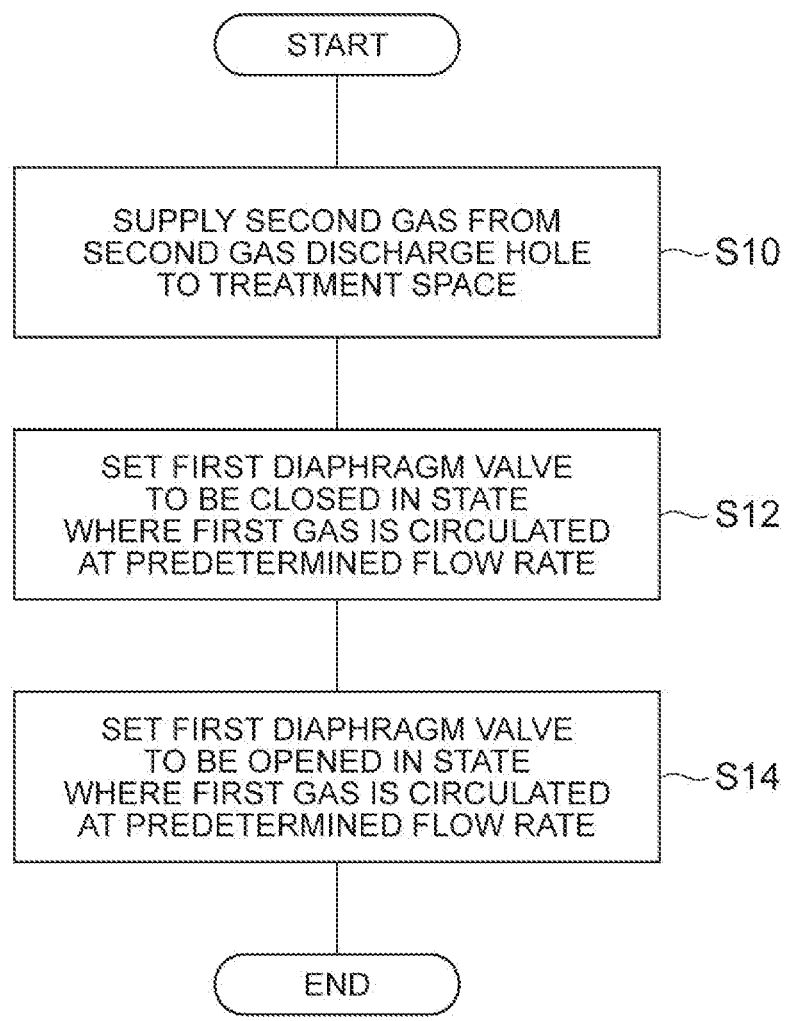
FIG. 8 is a flow diagram of a gas supply method according to the first exemplary embodiment.

Next, a gas supply method performed by the gas supply system 1 will be described. The gas supply method may be realized by components of the gas supply system 1 being operated by the controller C2. FIG. 8 is a flow diagram of a gas supply method according to the first exemplary embodiment.

Initially, the controller C2 supplies the second gas from the second gas source GS2 to the second flow channel L2. Thereby, the second gas is supplied from the second gas discharge hole 34a to the treatment space (step S10).

Subsequently, the controller C2 supplies the first gas from the first gas source GS1 to the first flow channel L1. In this case, the controller C2 sets the first diaphragm valve DV1 to be closed (step S12). Thereby, the first gas circulates through the first flow channel L1 at a predetermined flow rate, and is exhausted from the exhaust port OT1. The first flow channel L1 enters a state where the first gas having a predetermined target pressure circulates in a state where the supply of the first gas to the chamber 12 is stopped.

Subsequently, the controller C2 sets the first diaphragm valve DV1 to be opened in a state where the first gas is circulated at a predetermined flow rate in the first flow channel L1 (step S14). Thereby, the first gas is supplied from the first gas discharge hole 34b to the treatment space.

Steps S12 and S14 are repeated if necessary. In a case where all the processes are terminated, the controller C2 sets the secondary valve VL5 to be closed, and sets the first diaphragm valve DV1 to be closed. In this manner, the first gas can be added to the second gas by controlling switching of the first diaphragm valve DV1.

[Conclusion of First Exemplary Embodiment]

In the gas supply system 1, the first gas is supplied from the first flow channel L1 through the plurality of first gas discharge holes 34b to the treatment space S, and the second gas is supplied from the second flow channel L2 through the plurality of second gas discharge holes 34a to the treatment space S. In this manner, the first gas and the second gas are supplied to the treatment space S without being merged with each other. Therefore, the gas supply system 1 can save a time which will be taken until the merged gas reaches the chamber 12, as compared with a case where the first gas and the second gas are merged with each other before these gases are supplied to the chamber 12. Therefore, the gas supply system 1 is an excellent response speed. In addition, each of the first diaphragm valves DV1 to DV4 is disposed between the first flow channel L1 and the first gas discharge hole 34b, that is, in the vicinity of the treatment space S. Therefore, the gas supply system 1 can supply and control the first gas with good responsiveness through the first diaphragm valves DV1 to DV4, and can perform high-speed switching between a case where only the second gas is supplied to the treatment space S and a case where a mixed gas of the first gas and the second gas is supplied to the treatment space S. Thus, the gas supply system 1 can improve the response speed of a process gas, and also further improve the switching speed of the process gas. Further, the gas supply system 1 can control the supply and stop of the first gas for each first gas discharge hole.

In addition, in the gas supply system 1, the first gas is supplied to the first flow channel L1 at a predetermined pressure by the control valve VL1, and circulates from the supply port IN1 of the first flow channel L1 to the exhaust port OT1. The first gas is supplied from the outlets of the first orifices OL1 to OL4 to the first gas discharge hole 34b by switching of the first diaphragm valves DV1 to DV4. Therefore, the gas supply system 1 can stabilize the pressure of the first flow channel L1 in the entire flow channel, and branch the first gas from each of a plurality of points of the first flow channel L1 of which the pressure is stabilized. Thus, the gas supply system 1 can reduce a pressure error for each first gas discharge hole 34b. In addition, the gas supply system 1 includes the first orifices OL1 to OL4 corresponding to the first gas discharge hole 34b, and thus can reduce a fluctuation in pressure within the first flow channel L1 due to switching of the first diaphragm valves DV1 to DV4.

In addition, the gas supply system 1 can predict the pressure of the first gas at the arrangement position of each of the first orifices OL1 to OL4, and thus can improve the accuracy of the flow rate of the first gas supplied from each first gas discharge hole 34b.

In addition, the gas supply system 1 includes the exhaust orifice OL9 downstream of the exhaust port OT1, and thus can reduce the differential pressure of the first gas dependent on a position within the first flow channel L1.

In addition, the gas supply system 1 can adjust a flow rate in consideration of a change in the flow rate of the first gas with a change in temperature, using the temperature detector TM1 that detects the temperature of the first gas in the first flow channel L1.

In addition, the gas supply method can continue to supply the second gas, for example, as a main gas of a process to the treatment space, and to intermittently supply the first gas, for example, as an additive gas at high speed to the treatment space. Therefore, the gas supply method can improve the response speed of a process gas, and to further improve the switching speed of the process gas.

Second Exemplary Embodiment

A gas supply system 1A according to a second exemplary embodiment is different from the gas supply system 1 according to the first exemplary embodiment, in the operation of the controller C2, and in that a flow rate control apparatus is included instead of the control circuit C1 and the control valve VL1, the first flow channel L1 does not have an exhaust port, an orifice and a diaphragm valve are disposed in the second flow channel L2 to correspond to the second gas discharge hole 34a, and each of gases supplied to the first flow channel L1 and the second flow channel L2 is a mixed gas. The other points are the same as each other. In the second exemplary embodiment, a description will be given with a focus on differences from the first exemplary embodiment, and a repeated description will not be given.

[Outline of Gas Supply System]

Figure 9:
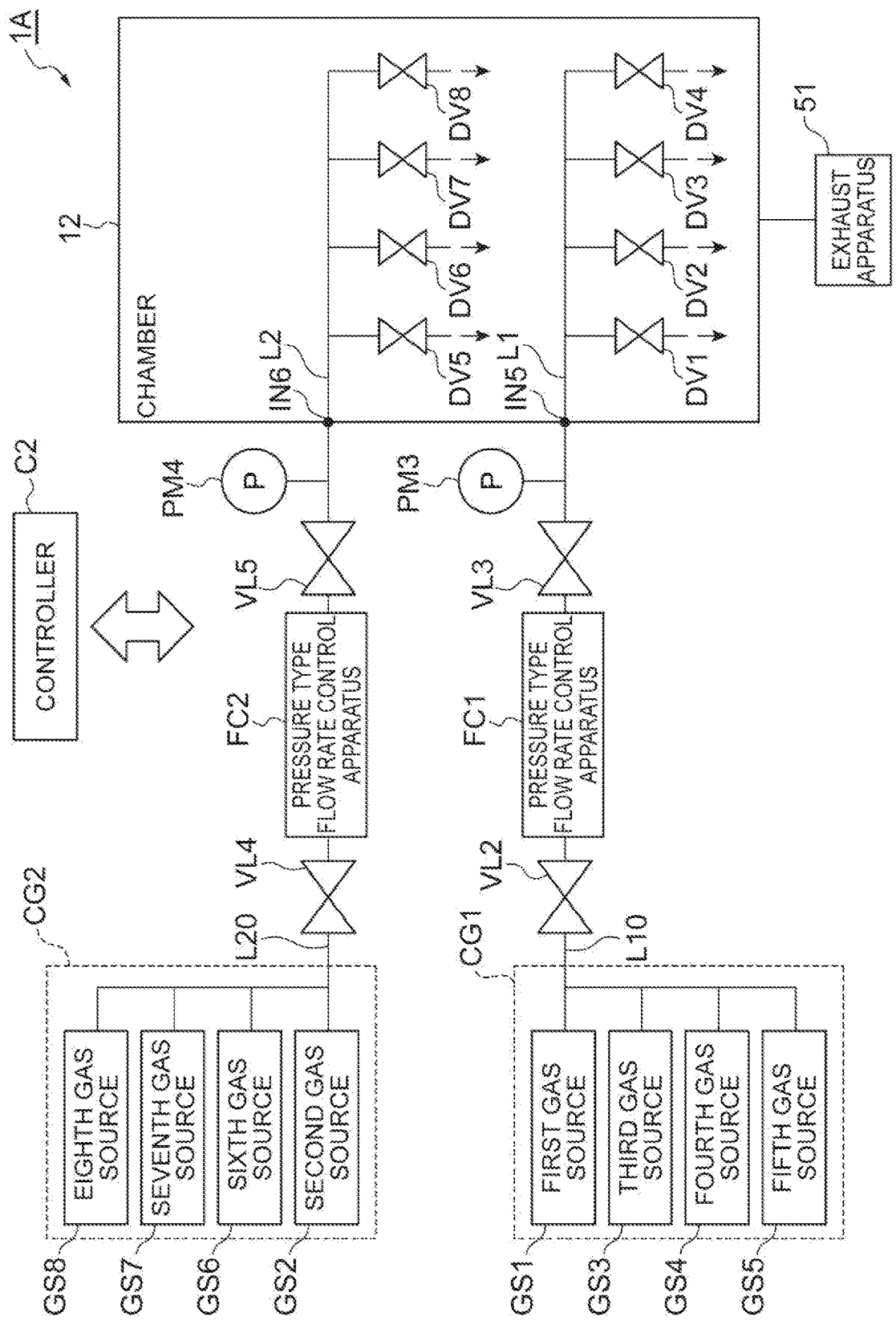
FIG. 9 is a schematic diagram of a gas supply system according to a second exemplary embodiment.

FIG. 9 is a schematic diagram of the gas supply system 1A according to the second exemplary embodiment. FIG. 9 shows the gas supply system 1A that supplies gases to a treatment space within the chamber 12 (an example of a treatment container) of the substrate treatment apparatus. The gas supply system 1A includes a first gas box CG1 and a second gas box CG2. The first gas box CG1 has a plurality of gas sources including the first gas source GS1. As an example, the first gas box CG1 includes the first gas source GS1, a third gas source GS3, a fourth gas source GS4, and a fifth gas source GS5, but there is no limitation thereto. The second gas box CG2 has a plurality of gas sources including the second gas source GS2. As an example, the second gas box CG2 includes the second gas source GS2, a sixth gas source GS6, a seventh gas source GS7, and an eighth gas source GS8, but there is no limitation thereto.

The first gas box CG1 supplies a first mixed gas obtained from a plurality of gas sources to the first flow channel L1. The first gas box CG1 is connected to the first flow channel L1 by the first main flow channel L10. The first main flow channel L10 connects the first gas box CG1 and the first flow channel L1 of the chamber 12 through a supply port IN5. A pressure type flow rate control apparatus FC1 (an example of a first flow rate controller) is provided between the first gas box CG1 and the first flow channel L1. A primary valve VL2 is provided on the upstream side of the pressure type flow rate control apparatus FC1, and a secondary valve VL3 and a third pressure detector PM3 are provided on the downstream side of the pressure type flow rate control apparatus FC1. Meanwhile, the flow rate control apparatus may be a thermal type flow rate control apparatus or a flow rate control apparatus based on other principles without being limited to the pressure type flow rate control apparatus.

The second gas box CG2 supplies a second mixed gas obtained from a plurality of gas sources to the second flow channel L2. The second gas box CG2 is connected to the second flow channel L2 by the second main flow channel L20. The second main flow channel L20 connects the second gas box CG2 and the second flow channel L2 of the chamber 12 throng a supply port IN6. A pressure type flow rate control apparatus FC2 (an example of a second flow rate controller) is provided between the second gas box CG2 and the second flow channel L2. A primary valve VL4 is provided on the upstream side of the pressure type flow rate control apparatus FC2, and a secondary valve VL5 and a fourth pressure detector PM4 are provided on the downstream side of the pressure type flow rate control apparatus FC2. Meanwhile, the flow rate control apparatus may be a thermal type flow rate control apparatus or a flow rate control apparatus based on other principles without being limited to the pressure type flow rate control apparatus.

The first flow channel L1 is connected to the first gas box CG1, and is formed inside the upper electrode (an example of the ceiling) of the chamber 12, or inside the sidewall of the chamber 12. The first flow channel L1 is a closed space to which the first mixed gas is supplied. The first flow channel L1 and the treatment space within the chamber 12 communicate with each other through the plurality of first gas discharge holes 34b. the first mixed gas is supplied from the plurality of first gas discharge holes 34b connected to the first flow channel L1 to the treatment space of the chamber 12. The first diaphragm valves DV1 to DV4 are provided between the first flow channel L1 and the first gas discharge hole 34b to correspond to the first gas discharge hole 34b. Meanwhile, the number of first diaphragm valves is not limited to four.

The second flow channel L2 is connected to the second gas box CG2, and is formed inside the upper electrode (an example of the ceiling) of the chamber 12, or inside the sidewall of the chamber 12. The second flow channel L2 is a closed space to which the second mixed gas is supplied. The second flow channel L2 and the treatment space within the chamber 12 communicate with each other through the plurality of second gas discharge holes 34a. The second mixed gas is supplied from the plurality of second gas discharge holes 34a connected to the second flow channel L2 to the treatment space of the chamber 12. Second diaphragm valves DV5 to DV8 are provided between the second flow channel L2 and the second gas discharge hole 34a to correspond to the second gas discharge hole 34a. Meanwhile, the number of second diaphragm valves is not limited to four.

The controller C2 (an example of a second controller) is different from the controller C2 of the first exemplary embodiment, in that the plurality of first diaphragm valves DV1 to DV4 and the plurality of second diaphragm valves DV5 to DV8 are brought into operation. The controller C2 brings each of the first diaphragm valves DV1 to DV4 into operation so that the flow rate of the first mixed gas within the first flow channel L1 is distributed and controlled for each first gas discharge hole 34b. The controller C2 brings each of the second diaphragm valves DV5 to DV8 into operation so that the flow rate of the second mixed gas within the second flow channel L2 is distributed and controlled for each second gas discharge hole 34a.

[Diaphragm Valve and Substrate Treatment Apparatus]

The configuration diaphragm valve is the same as that of the first exemplary embodiment. Meanwhile, in the second exemplary embodiment, the driving source of a diaphragm valve is a piezoelectric element. In addition, a substrate treatment apparatus to which the gas supply system 1A is applied is different from that of the first exemplary embodiment, in only the structure of the upper electrode.

[Details of Upper Electrode]

Figure 10:
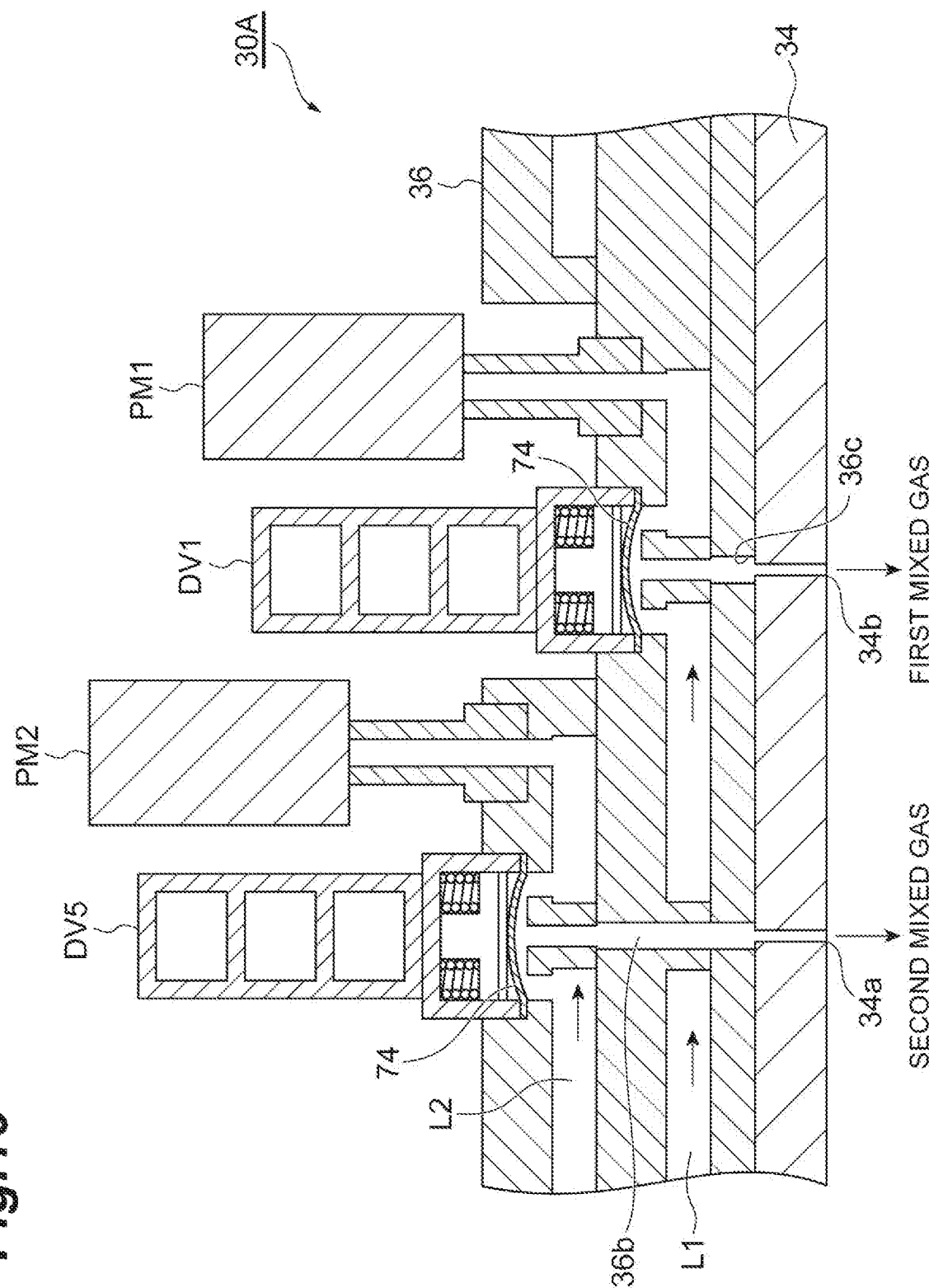
FIG. 10 is a schematic cross-sectional view of an upper electrode of the gas supply system according to the second exemplary embodiment.

FIG. 10 is a schematic cross-sectional view of an upper electrode 30A of the gas supply system 1A according to the second exemplary embodiment. As shown in FIG. 10, the first flow channel L1 and the second flow channel L2 that extend in a horizontal direction are provided inside the support 36 of the upper electrode 30A. The first flow channel L1 is located below the second flow channel L2.

A plurality of communication holes 36c for connecting the first flow channel L1 and a plurality of first gas discharge holes 34b extending downward of the first flow channel L1 are formed in the support 36. The first diaphragm valve DV1 is provided between the first flow channel L1 and the first gas discharge hole 34b of the support 36. The first mixed gas flowing through the first flow channel L1 is supplied to the treatment space through the communication hole 36c and the first gas discharge hole 34b when the first diaphragm valve DV1 is opened. Other first gas discharge holes 34b also have the same configuration.

A plurality of communication holes 36b for connecting the second flow channel L2 and a plurality of second gas discharge holes 34a extending downward of the second flow channel L2 are formed in the support 36. A second diaphragm valve DV5 is provided between the second flow channel L2 and the second gas discharge hole 34a of the support 36. The second mixed gas flowing through the second flow channel L2 is supplied to the treatment space through the communication hole 36b and the second gas discharge hole 34a when the second diaphragm valve DV5 is opened. Other second gas discharge holes 34a also include the same configuration.

Figure 11:
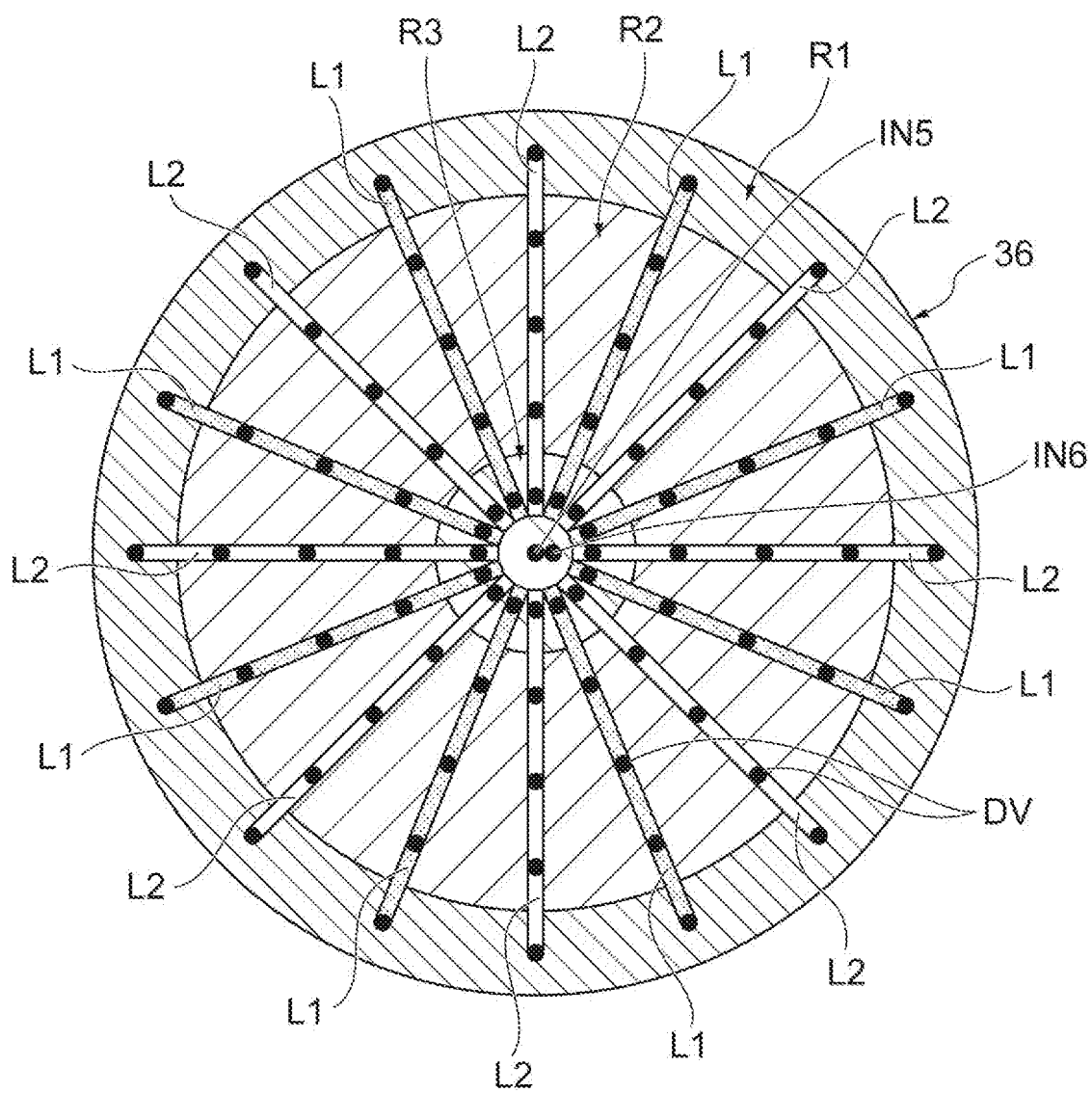
FIG. 11 is a schematic diagram when the first flow channel and a second flow channel are seen in a plan view.

FIG. 11 is a schematic diagram when the first flow channel L1 and the second flow channel L2 are seen in a plan view. In FIG. 11, the first flow channel L1 and the second flow channel L2 extend from the center of the support 36 toward the outer side. The first flow channel L1 and the second flow channel L2 are alternately disposed in a radial direction. The supply port IN5 of the first flow channel L1 and the supply port IN6 of the second flow channel L2 are provided on the central side of the support 36. FIG. 11 shows eight first flow channels L1 and eight second flow channels L2 as an example. The first flow channel L1 and the second flow channel L2 are provided with a plurality of diaphragm valves DV to correspond to the plurality of first gas discharge holes 34b.

[Control of Controller]

The controller C2 inputs a recipe stored in the storage unit, and controls the switching operations of the plurality of first diaphragm valves DV1 to DV4 and the plurality of second diaphragm valves DV5 to DV8. The controller C2 controls the degrees of opening of the plurality of first diaphragm valves DV1 to DV4 on the basis of a relationship between a flow rate, a pressure and the degree of valve opening acquired in advance for each first gas discharge hole 34b, a measurement result of the third pressure detector PM3, and a target flow rate which is set for each first gas discharge hole 34b. Similarly, the controller C2 controls the degrees of opening of the plurality of second diaphragm valves DV5 to DV8 on the basis of a relationship between a flow rate, a pressure and the degree of valve opening acquired in advance for each second gas discharge hole 34a, a measurement result of the fourth pressure detector PM4, and a target flow rate which is set for each second gas discharge hole 34a.

Figure 12:
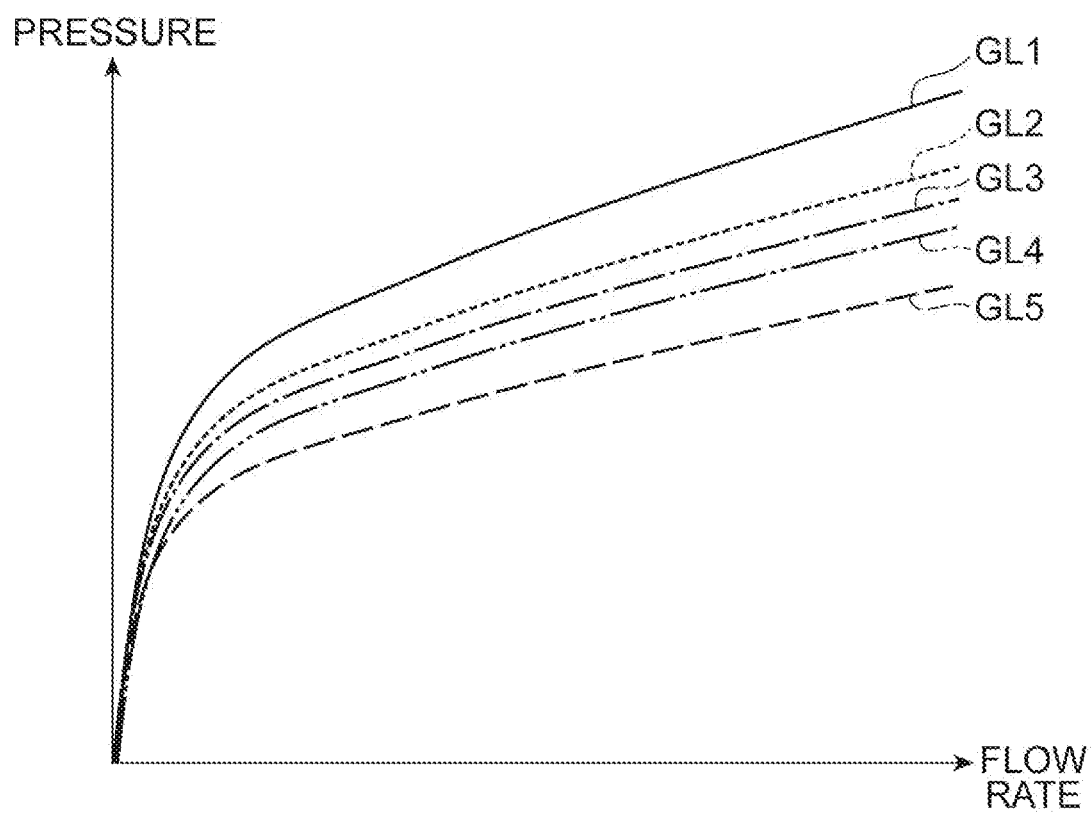
FIG. 12 is a graph illustrating a relationship between a pressure and a flow rate for each discharge hole.

FIG. 12 is a graph illustrating a relationship between a pressure and a flow rate for each discharge hole. The horizontal axis is a flow rate, and the vertical axis is a pressure. In FIG. 12, graphs GL1 to GL5 acquired in advance with respect to five discharge holes are disclosed. As shown in FIG. 12, the relationships between a pressure and a flow rate are different from each other for each discharge hole.

Figure 13:
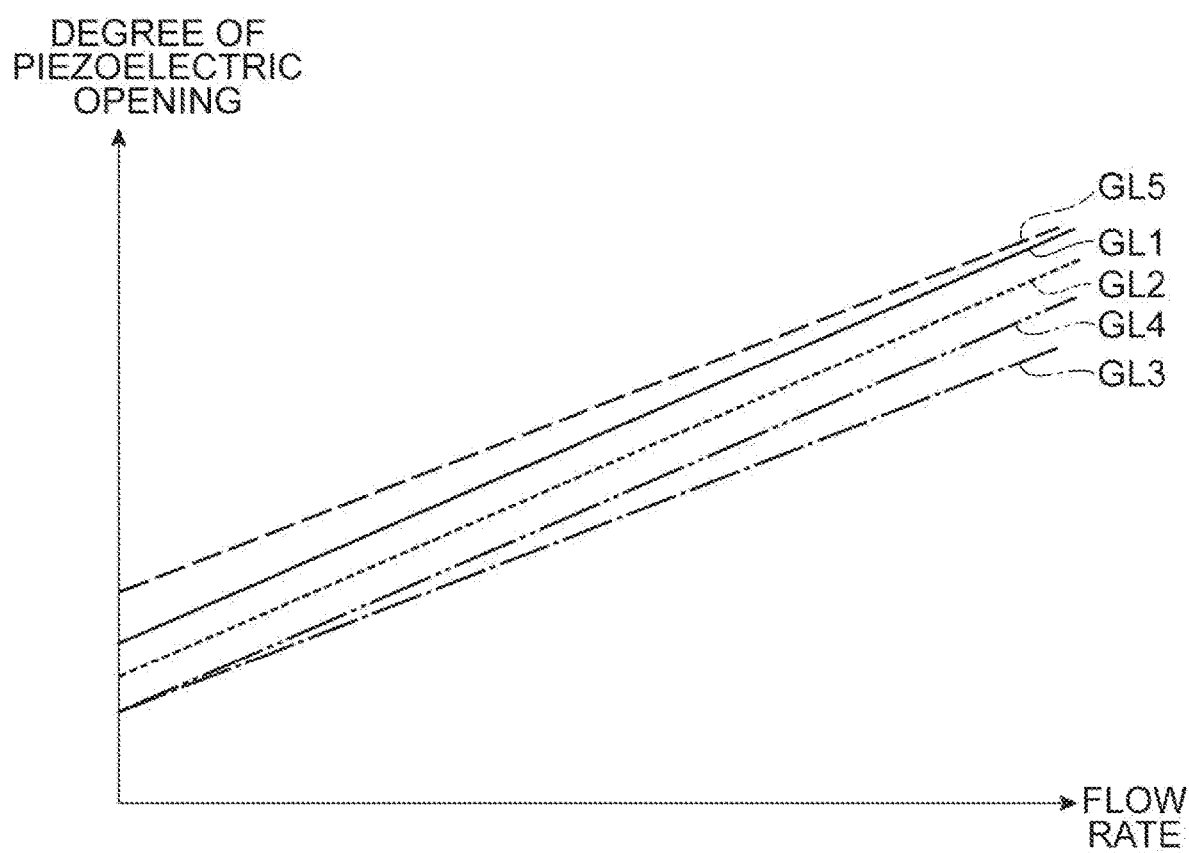
FIG. 13 is a graph illustrating are relationship between the degree of piezoelectric opening and a flow rate for each discharge hole.

FIG. 13 is a graph illustrating a relationship between the degree of piezoelectric opening and a flow rate for each discharge hole. The horizontal axis is a flow rate, and the vertical axis is the degree of piezoelectric opening. FIG. 13 shows graphs GL1 to GL5 acquired in advance with respect to five discharge holes. As shown in FIG. 13, the relationships between the degree of piezoelectric opening and a flow rate are different from each other for each discharge hole.

The controller C2 acquires a relationship between a flow rate, a pressure and the degree of valve opening for each discharge hole, using the relationship between a flow rate and a pressure and the relationship between a flow rate and the degree of valve opening which are shown in FIGS. 12 and 13. The controller C2 determines the degrees of opening of the plurality of first diaphragm valves DV1 to DV4 by referring to the relationship between a flow rate, a pressure and the degree of valve opening, on the basis of the measurement result of a pressure and the target flow rate which is set for each first gas discharge hole 34b. By such a determination, the controller C2 can distribute and control a mixed gas supplied to a closed space from each gas discharge hole, in consideration of a differential pressure within a flow channel.

[Gas Supply Method]

Figure 14:
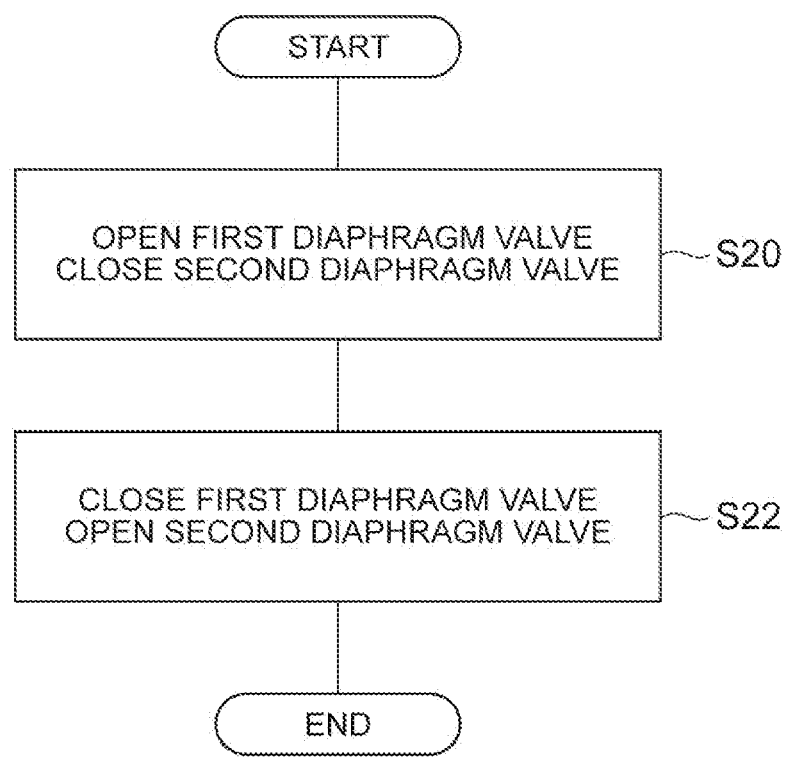
FIG. 14 is a flow diagram a gas supply method according to the second exemplary embodiment.

Next, a gas supply method performed by the gas supply system 1A will be described. The gas supply method may be realized by components of the gas supply system 1A being operated by the controller C2. FIG. 14 is a flow diagram of the gas supply method according to the second exemplary embodiment. Meanwhile, the first diaphragm valve and the second diaphragm valve are closed at the time of start.

Initially, the controller C2 supplies the first mixed gas having a predetermined flow rate from the first gas box CG1 to the first flow channel L1, sets the first diaphragm valve to be opened, and sets the second diaphragm valve to be closed (step SM1). The degree of opening of the first diaphragm valve is controlled for each first gas discharge hole 34b. Thereby, the first mixed gas having a predetermined flow rate is distributed for each first gas discharge hole 34b, and is supplied to the treatment space S.

Next, the controller C2 supplies the second mixed gas having a predetermined flow rate from the second gas box CG2 to the second flow channel L2, sets the second diaphragm valve to be opened, and sets the first diaphragm valve to be closed (step S22). The degree of opening of the second diaphragm valve is controlled for each second gas discharge hole 34a. Thereby, the second mixed gas having a predetermined flow rate is distributed for each second gas discharge hole 34a, and is supplied to the treatment space S.

Steps SM1 and S22 are repeated if necessary. In a case where all the processes are terminated, the controller C2 closes the secondary valve VL5, the first diaphragm valve and the second first diaphragm valve. In this manner, it is possible to perform high-speed switching between the first mixed gas and the second mixed gas by controlling switching of the diaphragm valves.

[Degree of Piezoelectric Opening]

Figure 15A:
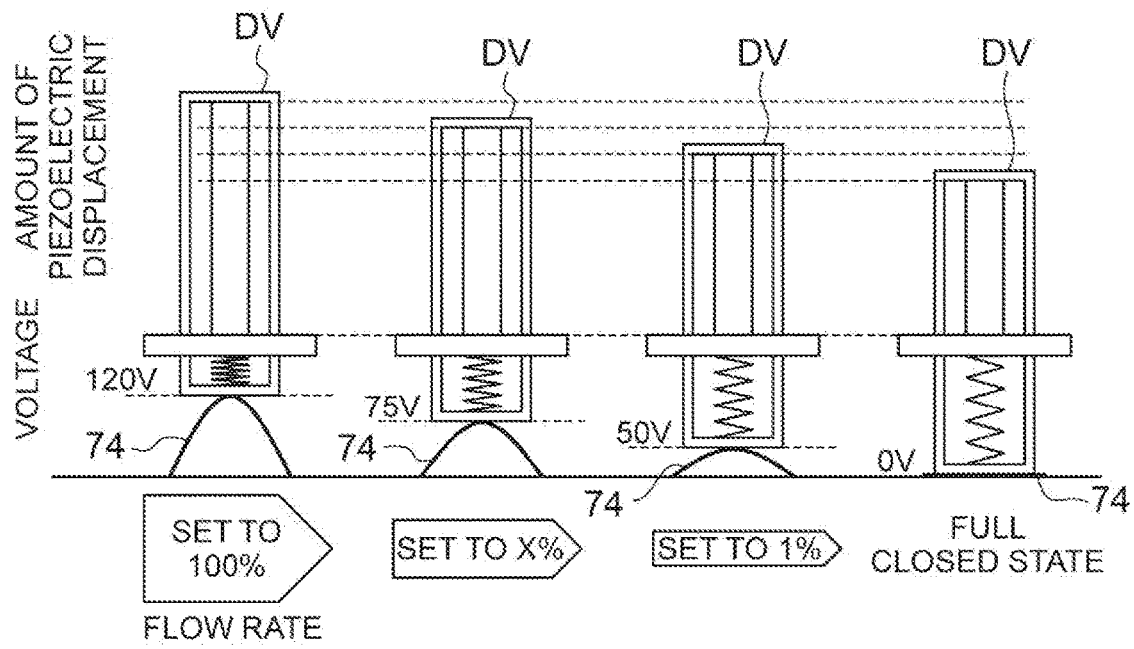
FIGS. 15A and 15B are an example of a relationship between the amount of piezoelectric displacement of a piezoelectric element and an applied voltage.
Figure 15B:
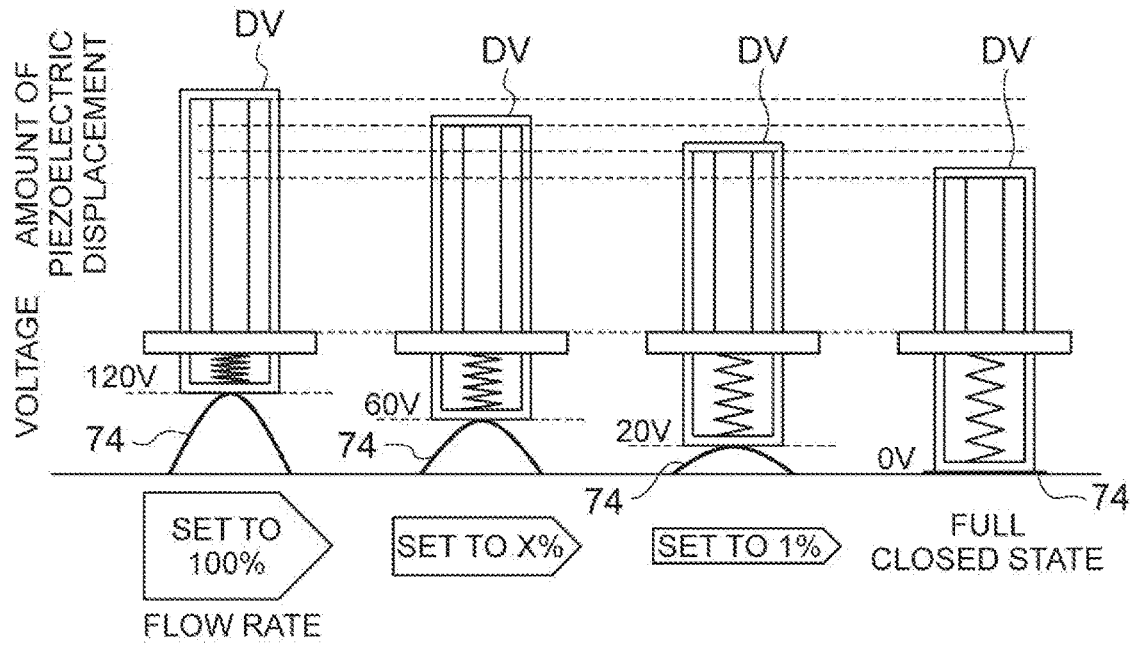

Next, control of the gas flow rate of a diaphragm valve using a piezoelectric element will be described in detail. FIGS. 15A and 15B are an example of a relationship between the amount of piezoelectric displacement (the degree of piezoelectric opening) of a piezoelectric element and an applied voltage. A first piezoelectric element (FIG. 15A) is fully opened (set to a flow rate of 100%) at an applied voltage of 120 V, and is closed (set to a flow rate of 0%) at an applied voltage of 0 V. Similarly to the first piezoelectric element, a second piezoelectric element (FIG. 15B) is also fully opened (set to a flow rate of 100%) at an applied voltage of 120 V, and is closed (set to a flow rate of 0%) at an applied voltage of 0 V. However, in a case where a flow rate is set to X % (100>X>1), the first piezoelectric element requires an applied voltage of 75 V, and the second piezoelectric element requires an applied voltage of 60 V. In addition, in a case where a flow rate is set to 1%, the first piezoelectric element requires an applied voltage of 50 V, and the second piezoelectric element requires an applied voltage of 20 V. In this manner, the piezoelectric element has a variation in an applied voltage for reaching the amount of piezoelectric displacement for each element.

Figure 16A:
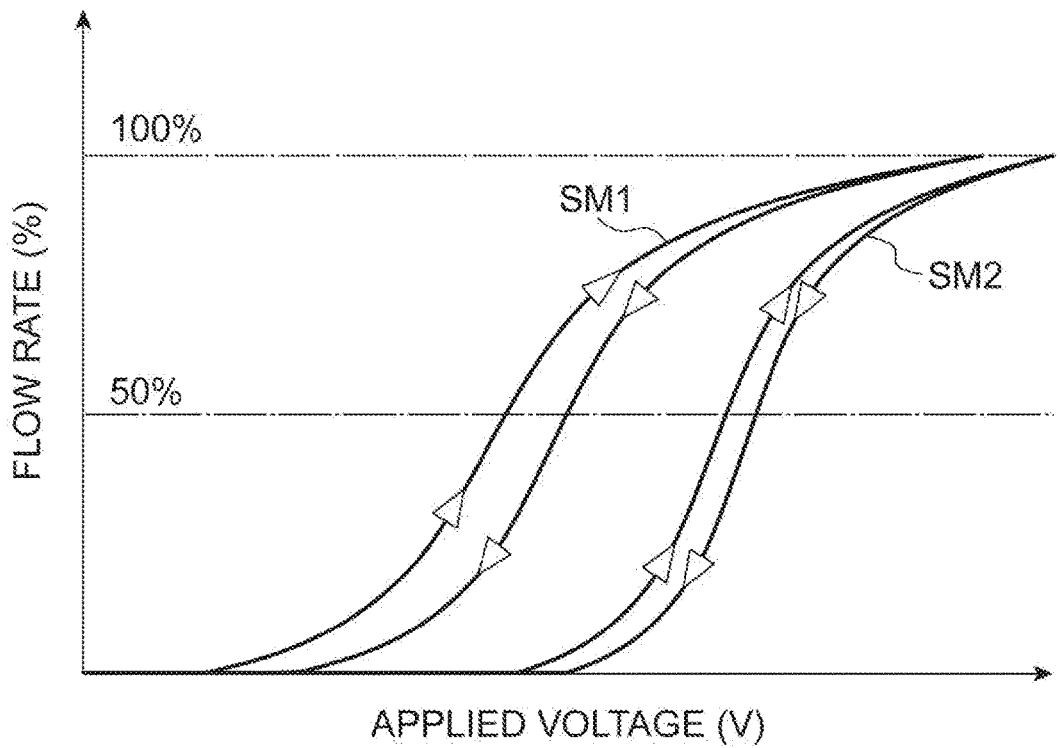
FIGS. 16A and 16B are graphs obtained by comparing a relationship between a flow rate and an applied voltage with a relationship between a flow rate and the amount of piezoelectric displacement.
Figure 16B:
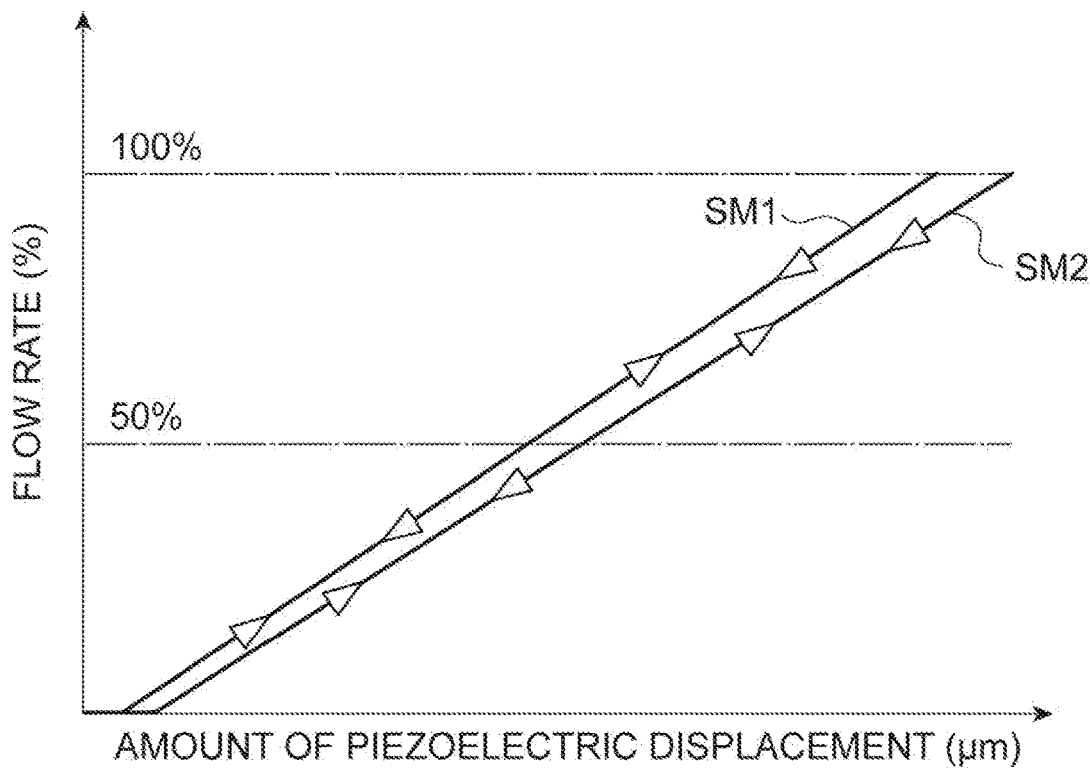

FIG. 16A is a graph illustrating a relationship between a flow rate and an applied voltage, and shows a graph SM1 relating to the first piezoelectric element A and a graph SM2 relating to the second piezoelectric element. The horizontal axis is an applied voltage, and the vertical axis is a flow rate. As shown in FIG. 16A, the relationship between an applied voltage and a flow rate is a hysteresis together with the first piezoelectric element and the second piezoelectric element. On the other hand, FIG. 16B is a graph illustrating a relationship between a flow rate and the amount of piezoelectric displacement, and shows a graph SM1 relating to the first piezoelectric element A and a graph SM2 relating to the second piezoelectric element. The horizontal axis is the amount of piezoelectric displacement, and the vertical axis is a flow rate. As shown in FIG. 16B, the relationship between the amount of piezoelectric displacement and a flow rate is linear together with the first piezoelectric element and the second piezoelectric element. Therefore, control of a piezoelectric element using the amount of piezoelectric displacement as a control parameter rather than control of a piezoelectric element using the applied voltage as a control parameter leads to excellent controllability and an error not being likely to occur. Therefore, in a case where switching control of a diaphragm is performed, the controller C2 does not perform switching control of a diaphragm using the applied voltage as a control parameter, and performs switching control of a diaphragm using the amount of piezoelectric displacement as a control parameter. Meanwhile, the amount of piezoelectric displacement can be monitored using a well-known sensor.

[Self-Diagnosis Function]

Figure 17:
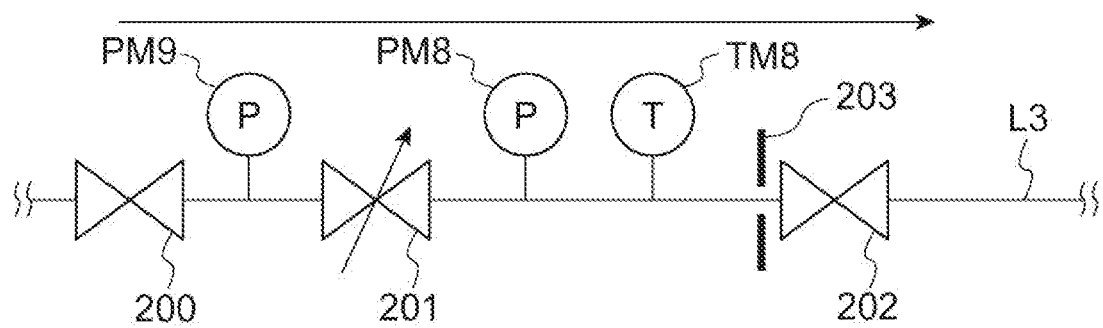
FIG. 17 is an example of a configuration in which a flow rate self-diagnosis is performed.

The controller C2 may have a function of determining whether the flow rate of a diaphragm valve is a control target. FIG. 17 is an example of a configuration in which a flow rate self-diagnosis is performed. In FIG. 17, a diaphragm valve 201 is disposed on a third flow channel L3. A pressure detector PM8, a temperature detector TM8, an orifice 203 and a secondary valve 202 are disposed downstream of the diaphragm valve 201. Here, a primary valve 200 and a pressure detector PM9 are disposed upstream of the diaphragm valve 201. The pressure detector PM9 is disposed, and thus it is possible to measure the primary-side pressure of the diaphragm valve 201. Therefore, it is possible to store the amount of piezoelectric displacement and the actual flow rate of the diaphragm valve 201 in association therewith. The controller C2 compares stored data with an actual measured value, and determines that a flow rate cannot be correctly controlled in a case where a relationship between the amount of piezoelectric displacement and the actual flow rate deviates from an allowable range. In this manner, the controller C2 can perform a self-diagnosis on a flow rate. In addition, the controller C2 can also determine that a piezoelectric element deteriorates with age in a case where it is determined that a flow rate cannot be correctly controlled. Therefore, the controller C2 can also predict a replacement timing of a piezoelectric element.

[Conclusion of Second Exemplary Embodiment]

In the gas supply system 1A, the first mixed gas including the first gas is controlled by the pressure type flow rate control apparatus FC1 to a predetermined flow rate, and is supplied to the first flow channel L1. Each of the first diaphragm valves DV1 to DV4 is operated by the controller C2. Thereby, the first mixed gas having a predetermined flow rate within the first flow channel L1 is distributed and controlled for each first gas discharge hole 34b. The second mixed gas including the second gas is controlled by the pressure type flow rate control apparatus FC2 to a predetermined flow rate, and is supplied to the second flow channel L2. Each of the second diaphragm valves DV5 to DV8 is operated by the controller C2. Thereby, the second mixed gas within the second flow channel L2 is distributed and controlled for each second gas discharge hole 34a. In this manner, the gas supply system can distribute and control a flow rate for each discharge hole.

The gas supply system 1A can control the degrees of opening of the first diaphragm valves DV1 to DV4 and the second diaphragm valves DV5 to DV8, on the basis of the relationship between a flow rate, a pressure and the degree of valve opening, the measurement result of a pressure, and the target value.

In addition, the controller C2 may control the degrees of opening of the first diaphragm valves DV1 to DV4 and the degrees of opening of the second diaphragm valves DV5 to DV8 using the amount of piezoelectric displacement as a parameter. In this case, the gas supply system can suppress control errors of the degrees of opening of the first diaphragm valves DV1 to DV4 and the second diaphragm valves DV5 to DV8, as compared with a case where a control voltage is used as a parameter.

In addition, according to the gas supply method of the second exemplary embodiment, it is possible to improve the response speed of a process gas, and to further improve the switching speed of the process gas.

As stated above, various exemplary embodiments have been described, but various modifications can be made without being limited to the above-described exemplary embodiments. For example, the respective exemplary embodiments may be combined. In addition, the above-described substrate treatment apparatus is a capacitive coupling type plasma treatment apparatus, but the substrate treatment apparatus may be an inductively coupled plasma treatment apparatus, or any plasma treatment apparatus such as a plasma treatment apparatus using surface waves of micro waves. In addition, an example has been described in which the first flow channel L1 and the second flow channel L2 are formed on the upper electrode, but the first flow channel L1 and the second flow channel 12 may be formed inside the sidewall of a chamber.

EXAMPLES

Hereinafter, examples and comparative examples carried out by the inventor will be set forth to describe the above effects, but the present disclosure is not limited the following examples.

(Improvement of Flow Rate Control Responsiveness)

Figure 18A:
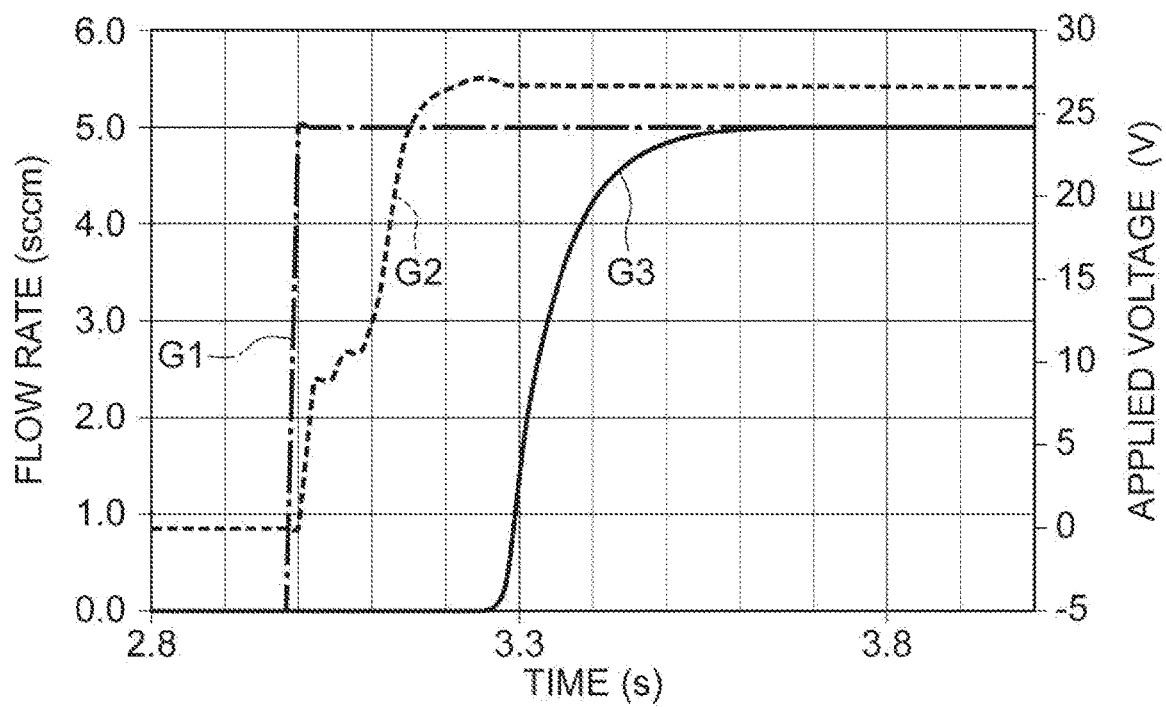
FIGS. 18A and 18B are graphs illustrating a relationship between a flow rate and a time in a comparative example and an example.
Figure 18B:
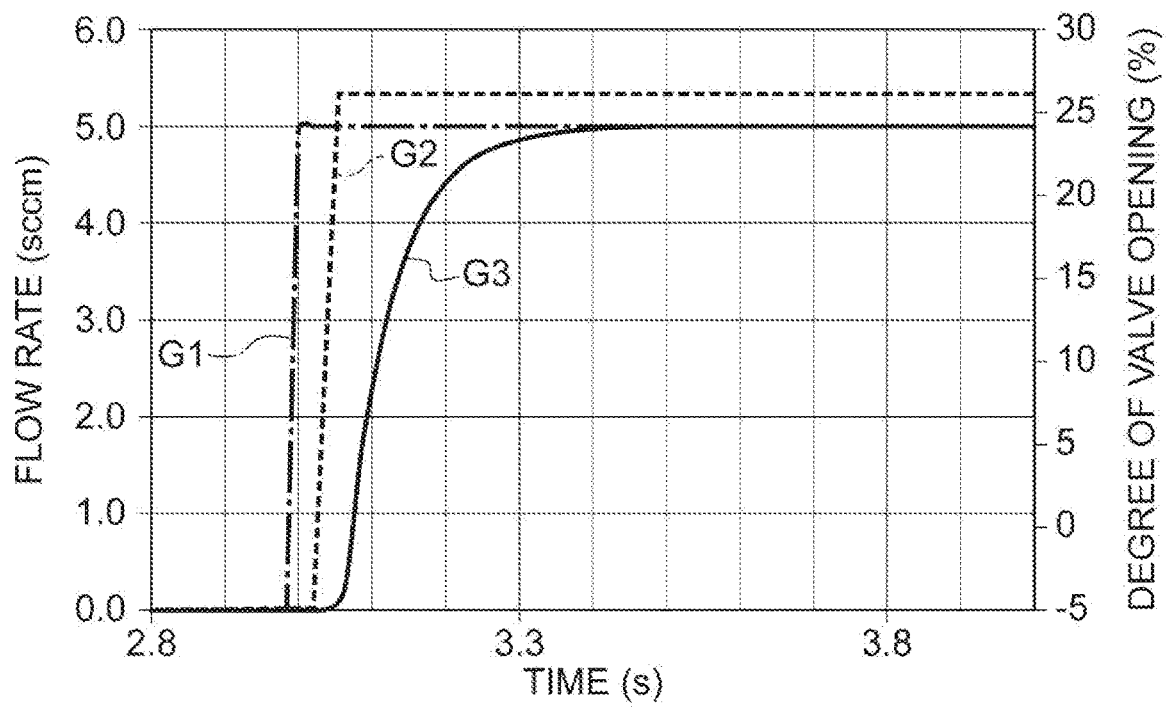

The flow rate control responsiveness of a diaphragm valve was verified. As an example, a flow rate was simulated using the amount of piezoelectric displacement as a control parameter. As a comparative example, a flow rate was simulated using an applied voltage as a control parameter. FIGS. 18A and 18B show results. FIGS. 18A and 18B are graphs illustrating a relationship between a flow rate and a time in the comparative example and the example. FIG. 18A is the comparative example. The horizontal axis is a time, and the vertical axis is a flow rate or an applied voltage. A graph G1 is a control target value, a graph G2 is an applied voltage value, and a graph G3 is a flow rate. FIG. 18B is the example. The horizontal axis is a time, and the vertical axis is a flow rate or the degree of valve opening (the amount of piezoelectric displacement). A graph G1 is a control target value, a graph G2 is the degree of valve opening, and a graph G3 is a flow rate. When the example and the comparative example are compared with each other, it is confirmed that the rise of the graph G3 is faster in the example than in the comparative example. Therefore, it is confirmed that the responsiveness of flow rate control is improved by using a control parameter as the degree of valve opening (the amount of piezoelectric displacement).

(Enhancement of Undershoot)

Figure 19A:
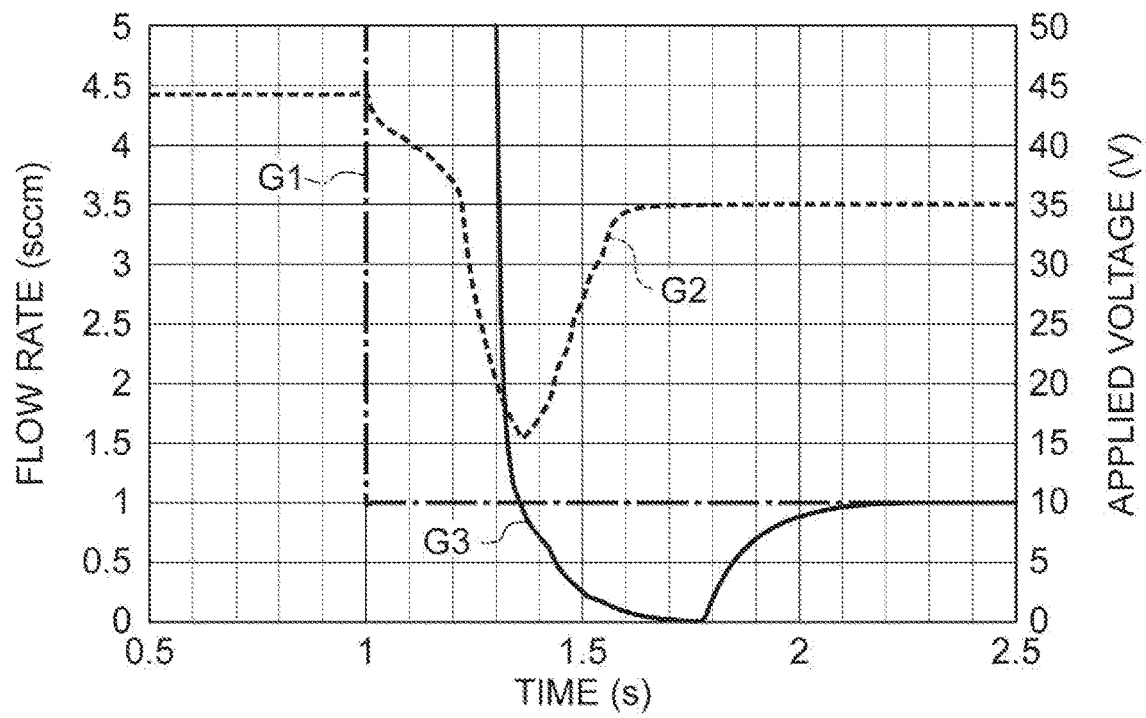
FIGS. 19A and 19B are graphs illustrating a relationship between a flow rate and a time in the comparative example and the example.
Figure 19B:
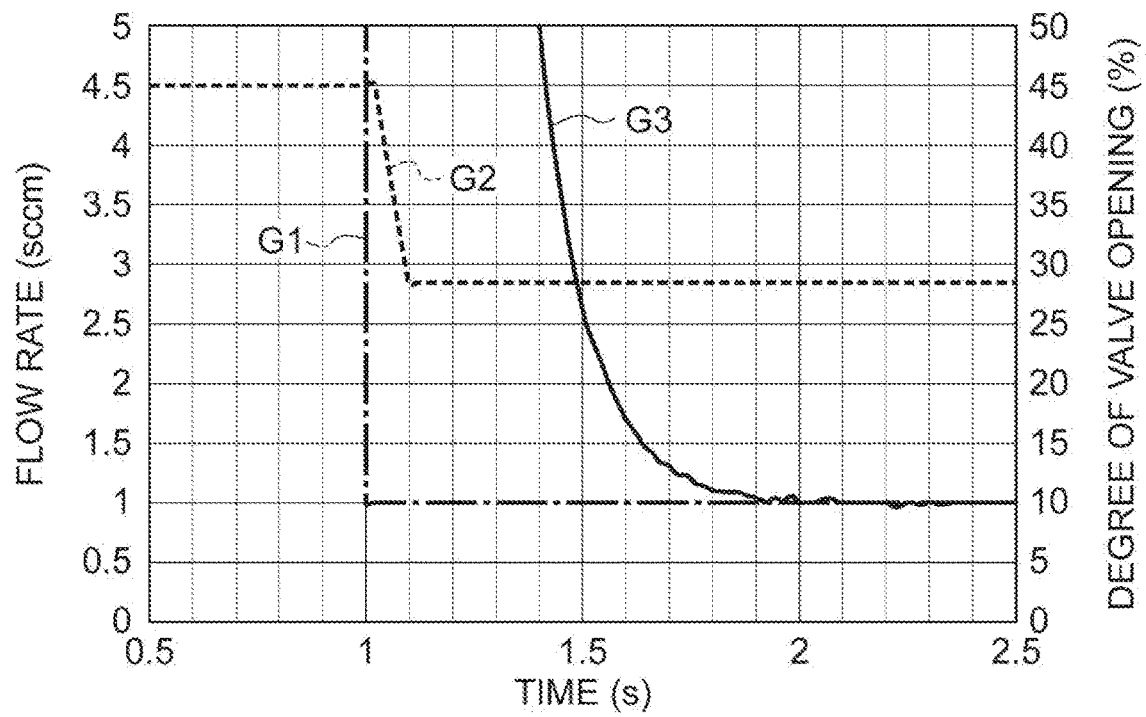

Undershoot during flow rate control of a diaphragm valve was verified. As the example, a flow rate was simulated using the amount of piezoelectric displacement as a control parameter. As the comparative example, a flow rate was simulated using an applied voltage as a control parameter. FIGS. 19A and 19B show results. FIGS. 19A and 19B are graphs illustrating a relationship between a flow rate and a time in the comparative example and the example. FIG. 19A is the comparative example. The horizontal axis is a time, and the vertical axis is a flow rate or an applied voltage. A graph G1 is a control target value, a graph G2 is an applied voltage value, and a graph G3 is a flow rate. FIG. 19B is the example. The horizontal axis is a time, and the vertical axis is a flow rate or the degree of valve opening (the amount of piezoelectric displacement). A graph G1 is a control target value, a graph G2 is the degree of valve opening, and a graph G3 is a flow rate. When the example and the comparative example are compared with each other, it is confirmed that the graph G3 is not undershot during fall in the example rather than the comparative example. Therefore, it is confirmed that undershoot is enhanced by using a control parameter as the degree of valve opening (the amount of piezoelectric displacement).

What is claimed is:

1. A gas supply system configured to supply a gas to a treatment space within a treatment container of a substrate treatment apparatus, the system comprising:
    a first flow channel connected to a first gas source of a first gas, formed inside a ceiling or a sidewall of the treatment container, and communicating with the treatment space through a plurality of first gas discharge holes, the first flow channel having a supply port to which the first gas is supplied and an exhaust port from which the first gas is exhausted and extending from the supply port to the exhaust port;
    a plurality of first diaphragm valves, wherein each of the first diaphragm valves is provided between the first flow channel and the first gas discharge hole to correspond to the first gas discharge hole;
    a control valve, provided upstream of the supply port, configured to control the first gas supplied to the supply port at a predetermined pressure;
    a plurality of first orifices, each of the first orifices being provided between the first flow channel and the first gas discharge hole to correspond to the first gas discharge hole;
    a first controller configured to bring the control valve and the plurality of first diaphragm valves into operation;
    a first pressure detector configured to detect a pressure of the first gas in a flow channel between the control valve and the supply port; and
    a second pressure detector configured to detect the pressure of the first gas exhausted from the exhaust port, wherein
    each of the first diaphragm valves controls a supply timing of the first gas supplied from an outlet of the first orifice to the first gas discharge hole,
    the control valve controls the pressure of the first gas on the basis of a detection result of the first pressure detector, and
    the first controller calculates the pressure of the first gas at an arrangement position of each of the first orifices on the basis of a detection result of the first pressure detector and a detection result of the second pressure detector, and controls a supply timing of the first gas through each of the first diaphragm valves on the basis of a result of calculation of the pressure.

2. The gas supply system according to claim 1, further comprising
    an exhaust orifice provided in the exhaust port of the first flow channel.

3. The gas supply system according to claim 2, further comprising
    a temperature detector configured to detect a temperature of the first gas in the first flow channel, wherein
    the control valve controls a flow rate of the first gas on the basis of a detection result of the temperature detector.

4. The gas supply system according to claim 1, further comprising
    a temperature detector configured to detect a temperature of the first gas in the first flow channel, wherein
    the control valve controls a flow rate of the first gas on the basis of a detection result of the temperature detector.

5. The gas supply system according to claim 1, wherein
    each of the first diaphragm valves includes a piezoelectric element configured to drive a diaphragm,
    the gas supply system further comprises a detector configured to measure an amount of displacement of the piezoelectric element, and
    the first controller controls a degree of opening of the first diaphragm valve using the amount of displacement as a parameter.

6. The gas supply system according to claim 1, further comprising
    a second flow channel connected to a second gas source of a second gas, formed inside the ceiling or the sidewall of the treatment container, and communicating with the treatment space through a plurality of second gas discharge holes.

7. The gas supply system according to claim 6, further comprising
    a plurality of second diaphragm valves, wherein each of the second diaphragm valves is provided between the second flow channel and the second gas discharge hole to correspond to the second gas discharge hole.

8. The gas supply system according to claim 7, further comprising:
    a first gas box having a plurality of gas sources including the first gas source, and supplying a first mixed gas, obtained from the plurality of gas sources, to the first flow channel;
    a first flow rate controller provided between the first gas box and the first flow channel;
    a second gas box having a plurality of gas sources including the second gas source, and supplying a second mixed gas, obtained from the plurality of gas sources, to the second flow channel;
    a second flow rate controller provided between the second gas box and the second flow channel; and
    a second controller configured to bring the plurality of first diaphragm valves and the plurality of second diaphragm valves into operation, wherein
    the first flow channel is a closed space to which the first mixed gas is supplied, the second flow channel is a closed space to which the second mixed gas is supplied, and the second controller brings each of the first diaphragm valves into operation so that a flow rate of the first mixed gas within the first flow channel is distributed and controlled for each of the first gas discharge holes, and brings each of the second diaphragm valves into operation so that a flow rate of the second mixed gas within the second flow channel is distributed and controlled for each of the second gas discharge holes.

9. The gas supply system according to claim 8, further comprising:

a third pressure detector configured to measure a pressure of the first mixed gas supplied to the first flow channel; and a fourth pressure detector configured to measure a pressure of the second mixed gas supplied to the second flow channel, wherein the second controller controls degrees of opening of the plurality of first diaphragm valves on the basis of a relationship between a flow rate, a pressure and a degree of valve opening acquired in advance for each of the first gas discharge holes, a measurement result of the third pressure detector, and a target flow rate which is set for each of the first gas discharge holes, and controls degrees of opening of the plurality of second diaphragm valves on the basis of a relationship between a flow rate, a pressure and a degree of valve opening acquired in advance for each of the second gas discharge holes, a measurement result of the fourth pressure detector, and a target flow rate which is set for each of the second gas discharge holes.

10. The gas supply system according to claim 8, wherein each of the first diaphragm valves and each of the second diaphragm valves include a piezoelectric element that drives a diaphragm, the gas supply system further comprises a detector that measures an amount of displacement of the piezoelectric element, and the second controller controls a degree of opening of the first diaphragm valve and a degree of opening of the second diaphragm valve using the amount of displacement as a parameter.

11. A gas supply method in a gas supply system that supplies a gas to a treatment space within a treatment container of a substrate treatment apparatus, wherein the gas supply system includes a first flow channel connected to a first gas source of a first gas, and formed inside a ceiling or a sidewall of the treatment container, the first flow channel having a supply port to which the first gas is supplied and an exhaust port from which the first gas is exhausted, extending from the supply port to the exhaust port, and communicating with the treatment space through a plurality of first gas discharge holes, a plurality of first orifices, each of the first orifices being provided between the first flow channel and the first gas discharge hole to correspond to the first gas discharge hole, a plurality of first diaphragm valves, wherein each of the first diaphragm valves is provided between the first flow channel and the first gas discharge hole to correspond to the first gas discharge hole, the plurality of first diaphragm valves controlling a supply timing of the first gas supplied from an outlet of the first orifice to the treatment space, a control valve, provided upstream of the supply port, configured to control a flow rate of the first gas from the supply port to the exhaust port to a predetermined flow rate, a first pressure detector configured to detect a pressure of the first gas in a flow channel between the control valve and the supply port, and a second pressure detector configured to detect the pressure of the first gas exhausted from the exhaust port, wherein the control valve controls the pressure of the first gas on the basis of a detection result of the first pressure detector, and the gas supply method comprises steps of:

calculating the pressure of the first gas at an arrangement position of each of the first orifices on the basis of a detection result of the first pressure detector and a detection result of the second pressure detector, and controlling a supply timing of the first gas through each of the first diaphragm valves on the basis of a result of calculation of the pressure;

closing each of the first diaphragm valves, in a state where the first gas is circulated at a predetermined flow rate from the supply port of the first flow channel to the exhaust port, and suspending the supply of the first gas to the treatment space;

opening the at least one first diaphragm valve, in a state where the first gas is circulated at a predetermined flow rate from the supply port of the first flow channel to the exhaust port, and supplying the first gas to the treatment space.

12. The gas supply method according to claim 11, the gas supply system further comprising:

a second flow channel connected to a second gas source of a second gas, formed inside the ceiling or the sidewall of the treatment container, and communicating with the treatment space through a plurality of second gas discharge holes.

13. The gas supply method according to claim 12, further comprising in the steps of closing and opening, supplying the second gas from the second gas discharge hole to the treatment space.

* * * * *